United States Patent [19]

Tran et al.

[11] Patent Number: 4,984,196

[45] Date of Patent: Jan. 8, 1991

[54] HIGH PERFORMANCE BIPOLAR DIFFERENTIAL SENSE AMPLIFIER IN A BIICMOS SRAM

[75] Inventors: Hiep V. Tran, Carrollton; David B. Scott, Plano, both of Tex.

[73] Assignee: Texas Instruments, Incorporated, Dallas, Tex.

[21] Appl. No.: 198,368

[22] Filed: May 25, 1988

[51] Int. Cl.⁵ .......................................... G11C 11/40
[52] U.S. Cl. .................................. 365/51; 365/189.01; 365/230.06; 365/177; 365/207; 357/43
[58] Field of Search ............... 365/177, 190, 207, 208, 365/206, 51, 189.01, 189.04, 189.05, 230.01, 230.06; 357/43

[56] References Cited

PUBLICATIONS

U.S. patent application, Ser. No. 129,261, filed on Dec. 7, 1987, assigned to Texas Instruments Incorporated, Docket No. TI-13151, Havemann et al.

U.S. patent application, Ser. No. 156,520, filed on Feb. 16, 1988, assigned to Texas Instruments Incorporated, Docket No. TI-13235, Lu et al.

*Primary Examiner*—Terrell W. Fears
*Attorney, Agent, or Firm*—Stanton C. Braden; Rodney M. Anderson; Melvin Sharp

[57] ABSTRACT

A sensing and decoding scheme layout for a memory device comprising an array made up of columns and rows of memory cells is disclosed wherein sense amplifiers and pairs of memory cell columns are positioned so as to collectively fit within the pitches of the memory cells of the memory cell column pairs and where the sense amplifiers are connected in a one-to-one correspondence with columns of the memory cells.

11 Claims, 16 Drawing Sheets

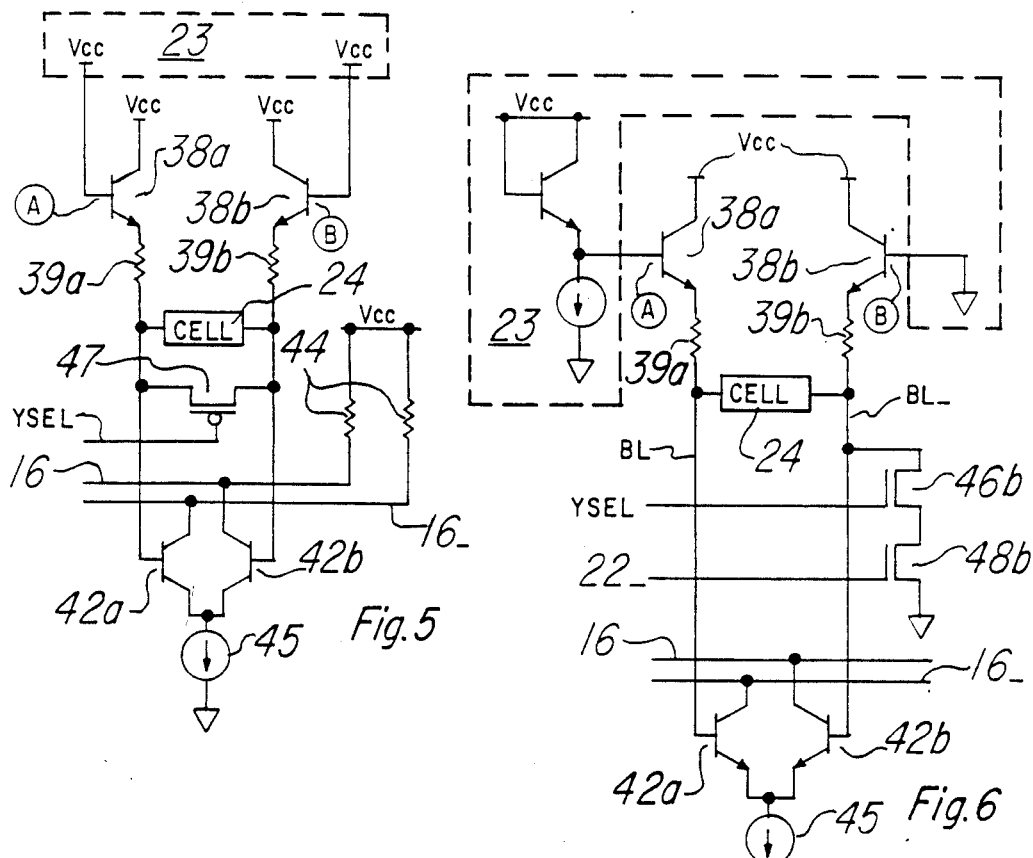
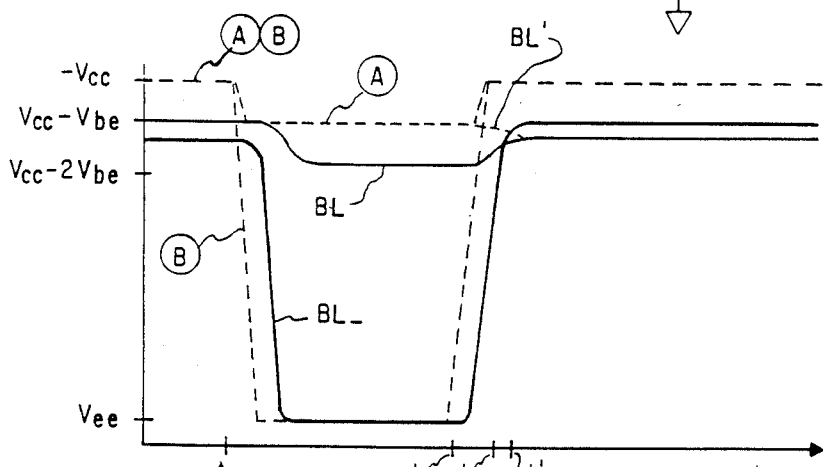
Fig. 5
Fig. 6
Fig. 7

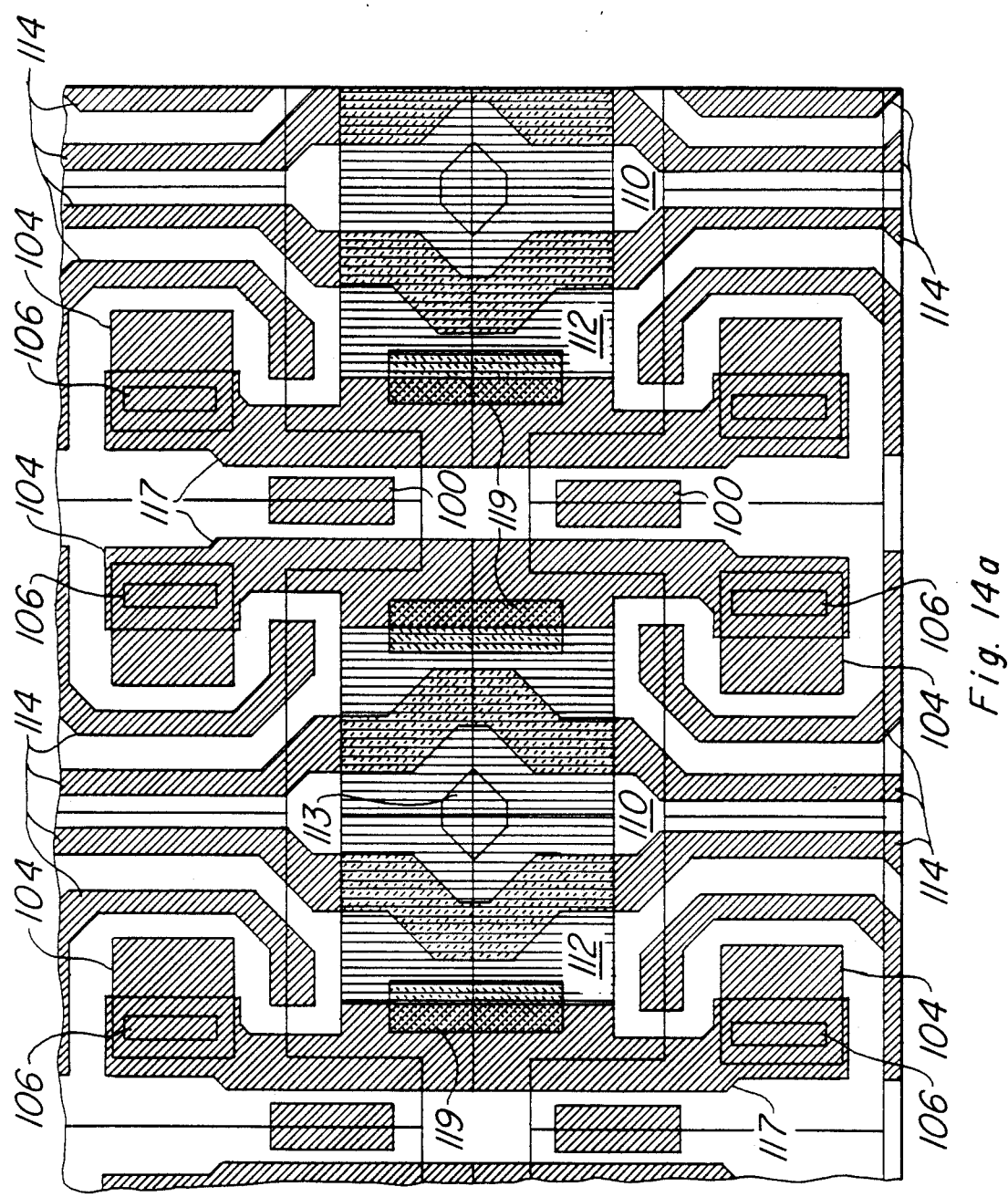

HIGH PERFORMANCE BIPOLAR DIFFERENTIAL SENSE AMPLIFIER IN A BIICMOS SRAM

BACKGROUND OF THE INVENTION

Integrated circuit memory devices are often organized into rows and columns of memory cells, with the rows and columns separately selected based on the value of the portions of the memory address which represent row and column addresses. In such devices, the term "word lines" generally refers to a set of conductors of which one, when active, selects the addressed row of memory cells; the term "bit lines" generally refers to a set of conductors which communicate data between memory cells in the addressed row and a sense amplifier. The sense amplifier is a circuit which senses the data state of the data on an associated bit line, and which generally amplifies the sensed data state for communication to output stages of the circuit.

Due to the drive capability of static memory cells, where the memory cell consists of a latch, multiple columns in many static random access memories (SRAMs) share a single sense amplifier. With reference to FIG. 1, each column of a memory array is connected by line 3 to its associated sense amplifier 10 through each column's associated pass transistor 7. Pass transistor 7, when turned on, allows electrical connection of a selected column to sense amplifier 10. Since the change in charge, Q, is equal to the capacitance, C, times the change in voltage, $\Delta V$, across the capacitor in pass transistor 7, that is $Q = C \cdot \Delta V$, then the time, t, to charge the capacitor is a function of Q over the charging current, I, or rather $t = f(Q/I)$. It is apparent that pass transistor 7 should be as large as possible in order to drive sense amp 10. However, as pass transistor 7 increases in size, its capacitance increases in size thereby decreasing the switching speed of the pass transistor and thus slowing down the operation of the memory device.

OBJECTS OF THE INVENTION

It is an object of the invention to provide a new and improved sensing and decoding scheme for a RAM device.

It is an object of the invention to provide a new and improved sensing and decoding scheme for a static RAM device.

It is another object of the invention to provide a sensing and decoding scheme for a static RAM device which allows for a reduced data line load for sense amplifiers.

It is a further object of this invention to provide such a scheme for an static RAM having a single sense amplifier for each column of memory cells.

It is still another object of this invention to provide a layout for such a scheme.

These and other objects of the invention, together with the features and advantages thereof, will become apparent from the following detailed specification when read together with the accompanying drawings in which applicable reference numerals have been carried forward.

SUMMARY OF THE INVENTION

The foregoing objects of the invention are accomplished by a sensing and decoding scheme wherein a sense amplifier is provided in a one-to-one correspondence with each column of a memory array comprising memory cells. The columns of memory are arranged in pairs and each pair is associated with a sense amplifier.

Each sense amplifier includes transistors and is assigned to an associated set. Terminals of selected transistors from sense amplifiers from the same set are connected together so as to form a pair of data lines.

The sense amplifiers and their associated memory cell column pairs are positioned so as to fit within the pitches of the memory cells of the associated memory cell column pairs.

BRIEF DESCRIPTION OF THE DRAWINGS

FIGS. 5 and 6 are electrical diagrams, in schematic form, illustrating biasing of the pull-up transistors for read and write cycles according to the invention.

FIG. 7 is a timing diagram showing the operation of the column of FIG. 4 during read and write cycles.

FIGS. 12, 13, 14, 14a, and 15 are drawings of superpositioned masks which show the relative locations of selected elements.

DETAILED DESCRIPTION OF THE INVENTION

Figure 1:
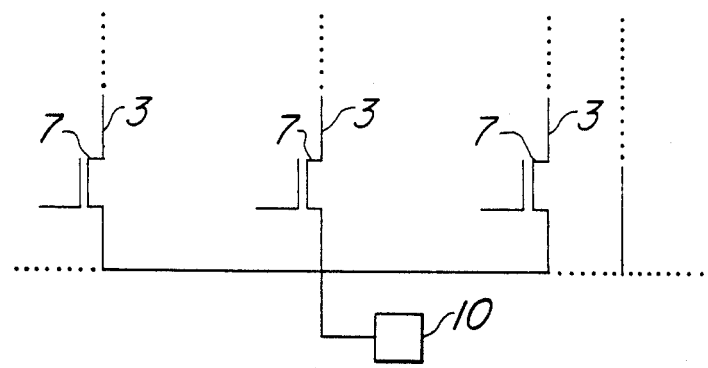
FIG. 1 is a drawing illustrating a prior art sensing and decoding scheme.

Because of the large capacitance possible attributable to pass transistors 7, shown in FIG. 1, it is desirable to eliminate pass transistors 7 completely and provide each column in the memory cell array with its own sense amplifier 10 so as to provide a one-to-one correspondence between columns and sense amplifiers. Additionally, a smaller effective bit line results through the elimination of the sense amplifiers. This gives the individual sense amplifiers better resolution in that they are able to detect smaller differential voltages due to the elimination of the capacitance associated with the eliminated sense amplifiers.

However, the provision of one sense amplifier per column increases the load that a particular sense amplifier is required to drive. In a 256 kbit SRAM organized into 256 rows by 1024 columns, for example, 1024 sense amplifiers must be provided for a one-to-one correspondence between sense amplifiers and columns. The sense amplifier which is associated with the selected column must be capable of driving a data line which is connectable to the 1023 other sense amplifiers. The capacitive load of such a long data line, especially including the parasitic load provided by isolation transistors decoupling the unselected sense amplifiers from the data line, either requires the provision of large drive transistors in each sense amplifier, or results in reduction in read access time performance. It should be noted that in the architecture where a single sense amplifier is provided for each column, the space required for a sense amplifier in one dimension (i.e., the sense amplifier pitch) can be no greater than the space required for providing a column of memory cells (i.e., the column pitch), without significantly expanding the size of the integrated circuit required for incorporating the SRAM device; such a pitch constraint will, of course, limit the size of the drive transistors which can be provided within the sense amplifier.

Figure 2:
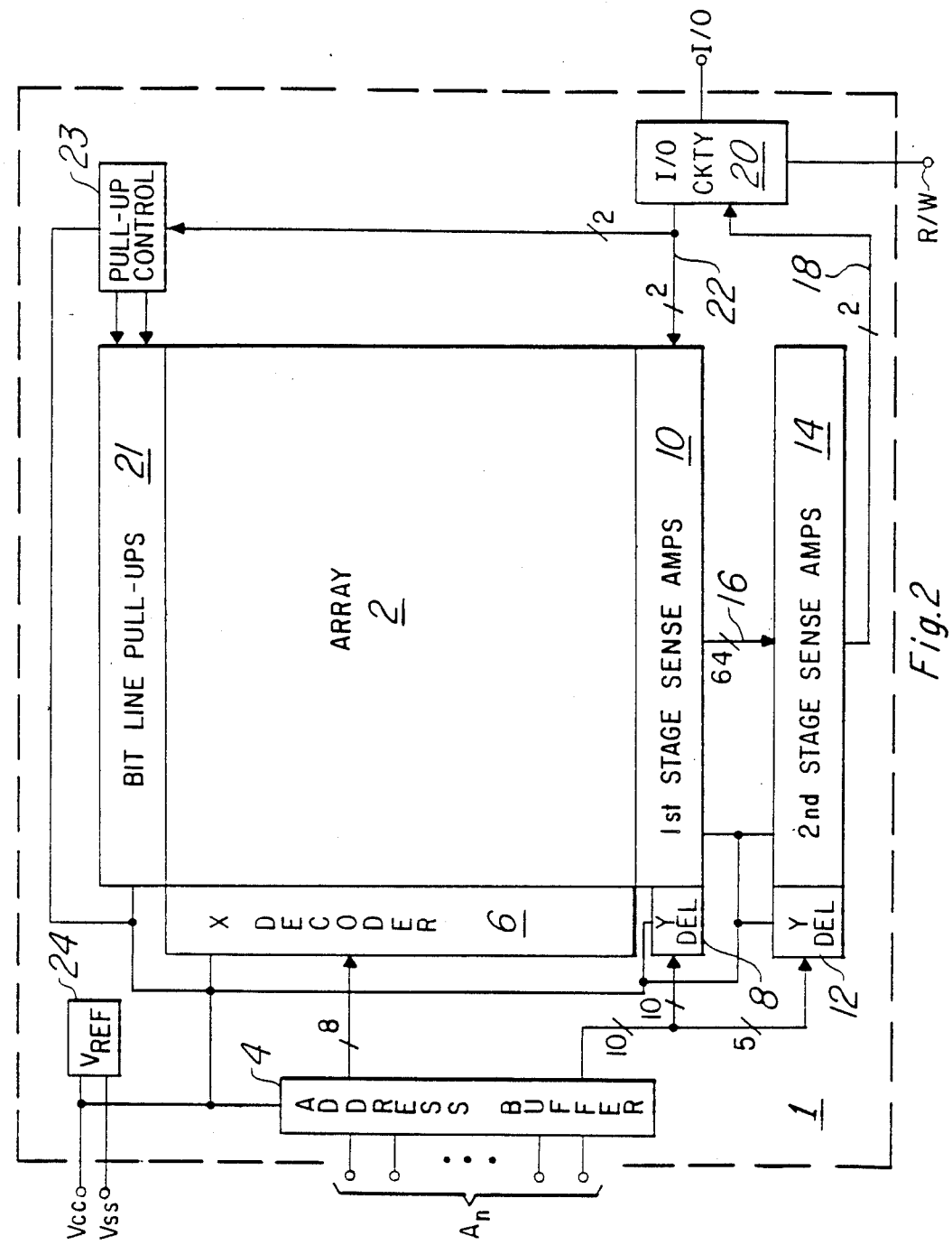
FIG. 2 is an electrical diagram, in block form, of a static random access memory (SRAM) incorporating the invention.

Referring now to FIG. 2, a block diagram of a static random access memory (SRAM) 1 is illustrated. This embodiment of SRAM 1 is a 256 k bit memroy, having a single input/output terminal I/O (i.e., SRAM 1 is organized as a 256 k by 1 memory). The storage elements of SRAM 1 are contained in array 2, which in this embodiment is organized into 256 rows by 1024 columns. SRAM 1 receives address information on address inputs $A_n$. To individually address each bit within the 256 k bit memory, address inputs $A_n$ number eighteen. Of course, if more than one bit were to be accessed at a time (for example, if 256 k bit SRAM 1 were organized as a 32 k by 8 memory, having eight inputs and eight outputs), fewer address inputs $A_n$ would be required.

Address inputs $A_n$ are received by address buffers 4 which, as is well known in the art, latch and retain the value of the address externally presented at address inputs $A_n$. Eight of the eighteen address bits received by address buffers 4, such eight bits corresponding to a row address, are communicated to X decoder 6, for selecting one of the 256 rows in array 2. The remaining ten bits received by address buffers 4, corresponding to a column address, are communicated to first stage Y decoder 8, for selection of one of the 1024 columns in array 2 to be sensed by one of the 1024 first stage sense amplifiers 10. Each of the 1024 columns, and accordingly each of the 1024 first stage sense amplifiers, are associated with a complementary pair of bit lines, as will be described hereinbelow, and the selected one of the 1024 first stage sense amplifiers senses the differential voltage of the complementary bit lines. A bank of bit line pull-up transistors 21 are provided in SRAM 1, as will be explained in further detail below.

Five of the ten column address bits are also communicated to second stage Y decoder 12, for selection of one of the second stage sense amplifiers 14. While FIG. 2 illustrates two separate Y decoders 8 and 12, second stage Y decoder 12 may alternatively be incorporated into first stage Y decoder 8. Such incorporation would use the output of the second stage sense amplifier 14 not only to select the appropriate second stage sense amplifier 14 but also in the decoding of the column address signal to select one of the first stage sense amplifiers 10, if multiple decoding stages are desired within first stage Y decoder 8 and if the break between decode stages therewithin is made at the point necessary to select one of the second stage sense amplifiers 14. The 1024 first stage sense amplifiers 10 are grouped into thirty-two groups of thirty-two, with each group having a complementary pair of local data lines 16 as an output. One of second stage sense amplifiers 14 is associated with each group of thirty-two first stage sense amplifiers, and receives at its input the associated pair of local data lines 16. A complementary pair of data-out lines 18 are driven by second stage sense amplifiers 14. In operation, the first stage sense amplifier 10 which corresponds to the column address is enabled by a signal from first stage Y decoder 8, while Y decoder 8 disables the others of first stage sense amplifiers 10 from sensing the data state of its associated pair of bit lines from array 2. The one of second stage sense amplifiers 14 which corresponds to the group of first stage sense amplifiers 10 having the selected column is also enabled, and the others of second stage sense amplifiers 14 are disabled. The selected one of second stage sense amplifiers 14 presents, on data-out lines 18, a differential voltage which is the amplification of the differential voltage on the local data lines 16 at its input, for communication to input/output circuitry 20. Input/output circuitry 20 communicates the state of data-out lines 18 to input/output terminal I/O.

Input/output circuitry 20 of SRAM 1 of FIG. 2 also receives input data from input/output terminal I/O; the determination of whether a read or a write cycle is desired depends upon the state of terminal R/W_, connected to input/output circuitry 20. During a write cycle, input/output circuitry 20 presents the logic state externally presented at input/output terminal I/O onto data-in bus 22, which presents the true and complement states of the input data to first stage sense amplifiers 10 for communication to the selected memory cell in array 2. Data-in bus 22 is also connected to pull-up control circuitry 23, to effect the write recovery operation described in further detail hereinbelow.

SRAM 1 also has reference voltage circuit 24, which receives the power supply voltages $V_{cc}$ and $V_{ee}$ (ground potential). Power supply voltages $V_{cc}$ and $V_{ee}$ are routed to transistors throughout SRAM 1 for biasing purposes, such routing not shown in FIG. 2 for purposes of clarity. The particular embodiment of SRAM 1 described herein is a BiCMOS SRAM, utilizing both bipolar transistors, as well as p-channel and n-channel MOS transistors. Certain circuits in this embodiment of SRAM 1 are realized in in emitter-coupled logic. Where emitter-coupled logic is used, reference voltage circuit 24 provides a band-gap reference voltage.

Figure 3:
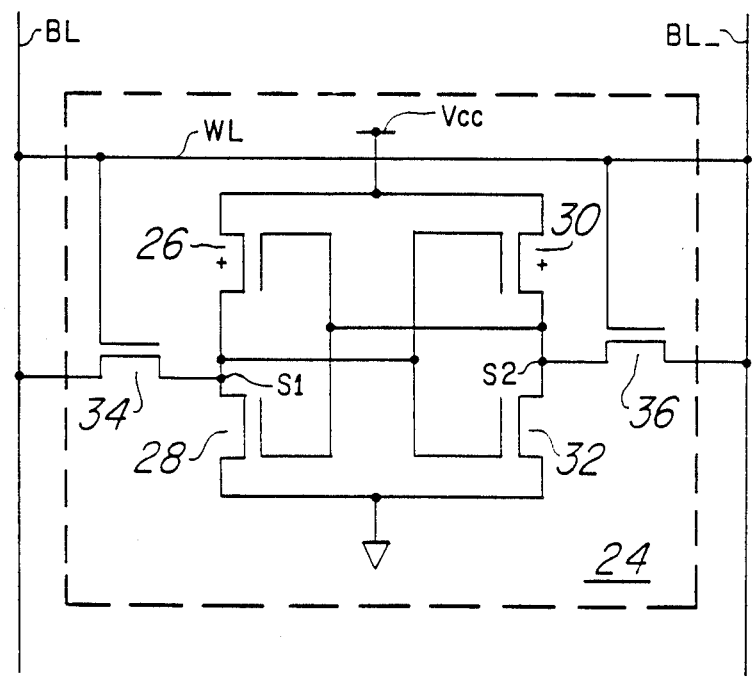
FIG. 3 is an electrical diagram, in schematic form, of a conventional CMOS memory cell as can be used in the SRAM of FIG. 1.

Referring now to FIG. 3, a conventional CMOS static memory cell 24 as incorporated into BiCMOS SRAM 1 is illustrated. Memory cell 24 is constructed according to the well-known cross-coupled inverter realization; since both p-channel and n-channel transistors are available, CMOS inverters are used in memory cell 24. A first CMOS inverter in memory cell 24 is made up of p-channel transistor 26 and n-channel transistor 28 having their source-to-drain paths connected in series between $V_{cc}$ and ground, and having their gates tied together. The second CMOS inverter in memory cell 24 is similarly constructed, with p-channel transistor 30 and n-channel transistor 32 having their source-to-drain paths connected in series between $V_{cc}$ and ground, and their gates also common. The cross-coupling is accomplished by the gates of transistors 26 and 28 being connected to the drains of transistors 30 and 32 (node S2 of FIG. 3), and by the gates of transistors 30 and 32 being connected to the drains of transistors 26 and 28 (node S1 of FIG. 3). N-channel pass transistor 34 has its source-to-drain path connected between node S1 and a first bit line BL, and has its gate connected to word line WL. N-channel pass transistor 36 similarly has its source-to-drain path connected between node S2 and a second bit line BL__, and has its gate also connected to word line WL.

In operation, the voltages of node S1 and S2 will necessarily be logical complements of one another, due to the cross-coupled nature of the CMOS inverters within memory cell 24. When word line WL is energized by X decoder 6 shown in FIG. 2, according to the row address received at address inputs $A_n$, pass transistors 34 and 36 will be turned on, coupling nodes S1 and S2 to bit lines BL and BL__, respectively. Accordingly, the state of bit lines BL and BL__ will be logical complements of one another when a memory cell 24 is connected thereto by the energizing of word line WL.

As described above for this embodiment, there are 256 word lines WL and 1024 pairs of bit lines BL and BL__ in array 2 of FIG. 2. For each value of the row address decoded by X decoder 6, one word line WL will be energized, connecting 1024 memory cells 24 to the 1024 pairs of bit lines BL and BL__. Since the other 255 word lines WL will be at a low logic level, only the one memory cell 24 associated with the selected word line WL in each column will be connected to the pair of bit lines BL and BL__ at a time.

Figure 4:
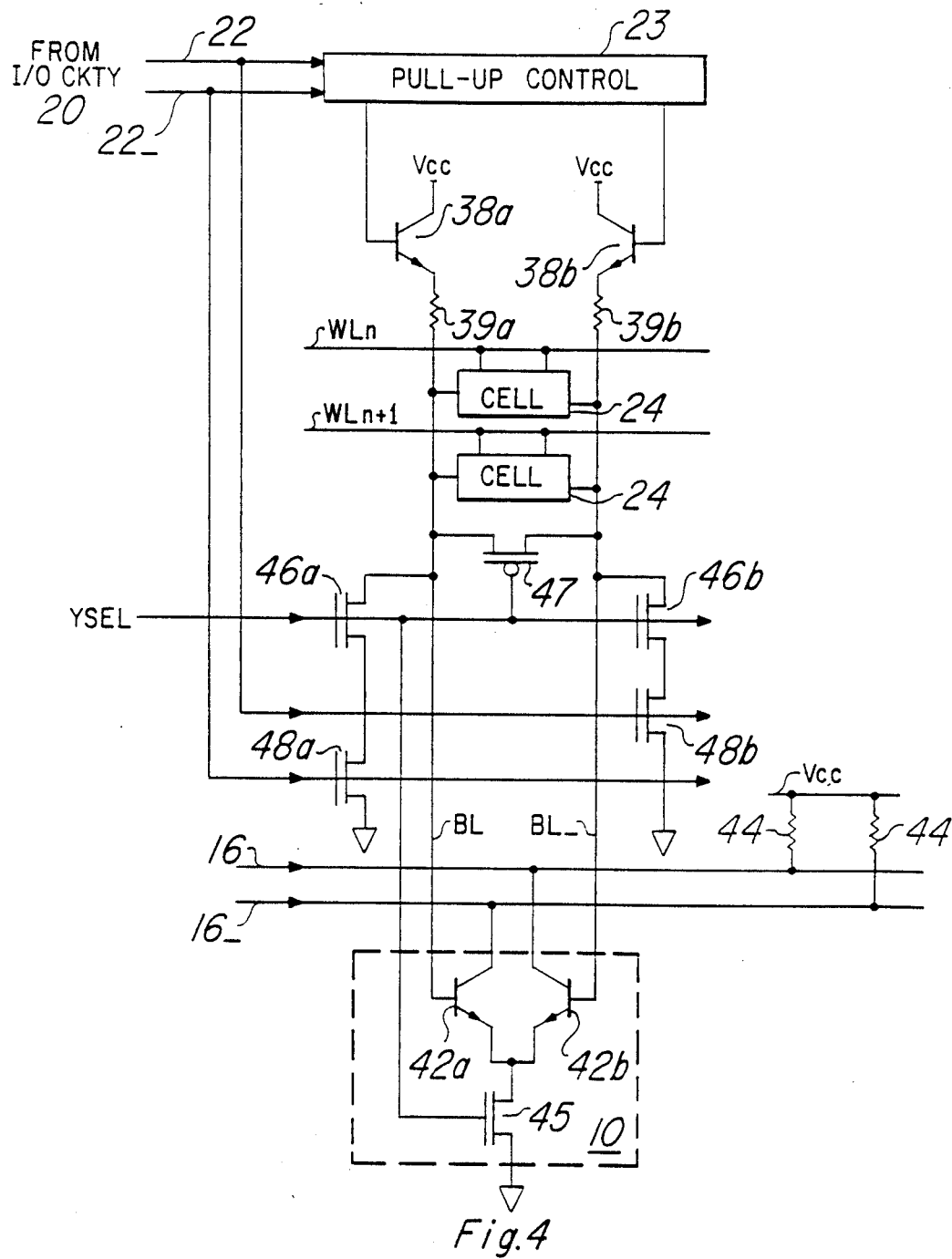
FIG. 4 is an electrical diagram, in schematic form, of a bit line pair in conjunction with the bit line pull-up circuitry and first stage sense amplifier.

Referring now to FIG. 4, a column of array 2 is illustrated. Only two memory cells 24 are illustrated, in conjunction with only two word lines $WL_n$ and $WL_{n+h}$ for purposes of clarity; as described above, each column has 256 memory cells 24 associated with 256 independent word lines WL. In the column shown in FIG. 3, cells 24 are shown connected to complementary bit lines BL and BL__. Bit lines BL and BL__ are connected to first stage sense amplifier 10 and, via n-p-n pull-up transistors 38a and 38b, respectively, to $V_{cc}$. Pull-up transistors 38 correspond to bit line pull-ups 21 shown in FIG. 2. The bases of pull-up transistors 38a and 38b are driven by pull-up control circuitry 23, which receives clocked input data from input/output circuitry 20 on data-in bus 22. Pull-up resistors 39a and 39b are connected between the emitter of transistors 38a and 38b and bit lines BL and BL__, respectively, to optimize the timing of the cross-over of bit lines BL and BL__ (indicating the sensed data) when pulled up by transistors 38a and 38b in a read operation.

First stage sense amplifier 10 consists of two emitter-coupled n-p-n transistors 42a and 42b, which have their bases connected to bit lines BL and BL__, respectively. The emitters of transistors 42a and 42b are connected to the drain n-channel transistor 45, which has its source coupled to ground and its gate connected to line YSEL. Transistor 45 is turned off when the column is not selected (i.e., line YSEL low), and is turned on to act as a current source when the column is selected (i.e., line YSEL high). Line YSEL also is connected to p-channel transistor 47, which serves to equalize bit lines BL and BL__ when transistor 47 is on due to line YSEL low. Line YSEL, for a particular column, is low during cycles in which the column is not selected, equalizing bit lines BL and BL__. The collectors of transistors 42a and 42b are connected to local data lines 16__ and 16, respectively. As described above for this embodiment, thirty-two first stage sense amplifiers 10 share local data lines 16 and 16__. Local data lines 16 and 16a__ are pulled up to $V_{cc}$ by resistors 44.

The write circuitry for a particular column consists of n-channel transistors 48a and 48b, which have their source-to-drain paths connected in a path between bit lines BL and BL__, respectively, and ground. The gates of n-channel transistors 48a and 48b are controlled by data-in lines 22__ and 22, respectively, one of which is taken to a high logic level at the time that a write operation is to occur, with the choice between data-in line 22 and 22__ depending upon the input data received at input/output terminal I/O. During read cycles, both data-in lines 22 and 22__ remain at a low logic level. N-channel transistors 46a and 46b are connected in series between transistors 48a and 48b, on the one hand, and bit lines BL and BL__, respectively, on the other hand. The gates of both of transistors 46a and 46b are controlled by line YSEL, so that the state of data-in lines 22 and 22__ affects only the selected one of the 1024 columns, and is isolated from the other columns.

FIG. 5 illustrates the equalivalent circuit for a selected column of FIG. 4 in a read operation. FIG. 7 is a timing diagram showing, in the first cycle therein, the operation of the read cycle. During a read cycle, both of data-in lines 22 and 22__ of FIG. 4 will be at a low logic level. Responsive thereto, pull-up control circuitry 23 will present $V_{cc}$ to the bases of each of pull-up transistors 38a and 38b (nodes A and B on FIGS. 5 and 6) so that the voltage at the emitters of transistors 38a and 38b is the same, $V_{cc}-V_{be}$, where $V_{be}$ is the forward-biased diode drop across the base-emitter junction. The memory cell 24 selected by its word line WL will present a differential voltage on bit lines BL and BL__. This description will be for the case where bit line BL is high relative to bit line BL__. Accordingly, since bit line BL is higher than bit line BL__, the associated first stage sense amplifier transistor 42a will be turned on more than transistor 42b associated with bit line BL__. Since transistor 45 is on, and acts as a current source to keep the sum of the currents through transistors 42a and 42b constant, the higher drive at the base of transistor 42a will cause the bulk of the current through transistor 45 to flow through transistor 42a relative to transistor 42b. Due to pull-up transistors 38a and 38b, bit line BL will remain at approximately $V_{cc}-V_{be}$, while bit line BL__ will slightly drop in voltage, as shown in FIG. 7.

Since transistor 42a is conducting the bulk of the current passing through transistor 45, relative to transistor 42b, local data line 16__ will be pulled low, while local data line 16 will remain high due to the minimal drive through transistor 42b. The other first stage sense amplifiers 10 which share local data lines 16 and 16__ will have their respective transistors 45 turned off, so that the only transistor pulling down one of data lines 16 and 16__ will be the transistor 42a or 42b driven by the higher bit line BL or BL__ associated with the selected column.

FIG. 6 illustrates the equivalent circuit during a write operation for a column constructed according to the invention and shown in FIG. 4. One of the data-in lines 22 or 22__ will be pulled to a high level by input/output circuitry 20, depending upon the input data received at input/output terminal I/O; in the example explained herein, data-in line 22 will be pulled to a high logic level for the write operation. This occurs at time $t_w$ shown on FIG. 7. Accordingly, transistor 48b of the column of FIG. 4 will be turned on by data-in line 22; since YSEL is asserted to a high level for the selected column, transistor 48b selects bit line BL__ to be pulled to a low level to effect the write, as illustrated in FIG. 6.

According to the invention, pull-up control circuitry 23 presents differing levels of bias to the bases of pull-up transistors 38a and 38b, depending upon the data state to be written, beginning at time $t_w$ at the beginning of a write operation. At node B, i.e., the base of transistor 38b, pull-up control circuitry will apply $V_{ee}$, since transistor 38b is associated with the bit line BL_ which is to be pulled to a low level since data-in line 22 (rather than line 22_) is pulled high. According to the invention, beginning at time $t_w$, pull-up control circuitry 23 applies to node A (the base of transistor 38a) a voltage which is reduced from the bias applied during the read cycle. In this embodiment, the applied voltage is one diode drop ($V_{be}$) below $V_{cc}$, due to transistor 50a biasing the base of transistor 38a. Accordingly, on the "high" bit line (the bit line opposite the one being pulled low which, in this case, is bit line BL), pull-up transistor 38a will be biased to be conductive, but so that the voltage at the emitter of pull-up transistor 38a is at a reduced voltage relative to the read cycle. In this case, the voltage of the high bit line BL is at $V_{cc}-2V_{be}$ during the write operation, while the voltage of the low bit line BL_ is pulled down to $V_{ee}$.

The write is accomplished since transistors 46b and 48b pull bit line BL_ to $V_{ee}$, setting node S2 in memory cell 24 (referring to FIG. 3) to a low level, so that the cross-coupled inverters in memory cell 24 latch the desired data state. The low level on bit line BL_ will turn transistor 42b off in first stage sense amplifier 10. Even though transistor 42a will conduct all of the current allowed through transistor 45 (its base being at a voltage $V_{cc}-2V_{be}$ which is sufficient to keep transistor 42a on), the current allowed into the base of transistor 42a is limited so that bit line BL will remain at approximately the voltage $V_{cc}-2V_{be}$. The effect of the low level of bit line BL_ through transistor 46b and 48b will be to override first stage sense amplifier 10, writing the desired data into memory cell 24. Once node S2 of memory cell 24 and the parasitic capacitance of bit line BL_ are discharged, the voltage of bit line BL_ will drop approximately to the voltage $V_{ee}$, as shown in FIG. 7.

The full benefit of the reduced bias of transistor 38a on the high bit line BL during the write operation is evidenced during the time after a write operation, and prior to a read operation (i.e., the write recovery time). Referring to FIG. 7, the end of the write cycle begins, at time $t_r$, with the one of data-in lines 22 or 22_ (in this case line 22) going from a high to a low logic level. This turns off transistor 48b, decoupling bit line BL_ from $V_{ee}$ and allowing it to become responsive to pull-up transistor 38b, in this example. Also responsive to data-in line 22 returning to a low level, pull-up control circuitry 23 returns the bias on the bases of transistors 38a and 38b (nodes A and B, respectively), to $V_{cc}$. For the bit line which was low in the prior write cycle, e.g., bit line BL_, this biasing of pull-up transistor 38b pulls bit line BL_ back up toward $V_{cc}-V_{be}$, as in the read cycle described earlier. For the bit line which was high in the prior write cycle, e.g., bit line BL, the biasing of pull-up transistor 38a pulls bit line BL from $V_{cc}-2V_{be}$ back toward $V_{cc}-V_{be}$, as in the earlier-described read cycle.

In the event that the data state of the selected memory cell 24 is the same state as that written by the write cycle, the two bit lines BL and BL_ will go back to the differential voltage as shown in the first read cycle of FIG. 7. No speed improvement will be evidenced in this example, since the voltages of bit lines BL and BL_ will not cross-over prior to settling to the read state. However, in the case where the data read by the second read cycle is opposite that written by the write cycle, the voltages of the bit lines BL and BL_ will cross-over at a time earlier after $t_r$ due to the reduced bias on the base of the pull-up transistor 38 on the high side during the write cycle. This case is illustrated in the second read cycle in FIG. 7, and obviously presumes that a memory cell 24 in a different row from that written to in the write cycle is read in the second read cycle (in order to read different data).

Since the high side bit line, in this case bit line BL, is being raised by pull-up transistor 38a from a lower voltage ($V_{cc}-2V_{be}$) to a higher voltage ($V_{cc}-V_{be}-dV$; dV being the delta voltage due to being the low side bit line in a read), the cross-over between the voltage of bit line BL and the voltage of bit line BL_ occurs at time $t_s$ shown in FIG. 7. At the time of the cross-over point ($t_s$), first stage sense amplifier 10 will flip to the proper data state as explained above, since the bit line of the high side (bit line BL_ in this case) will be driving its associated transistor 42 harder than will the bit line of the low side (BL), accomplishing the read. If the high side bit line from the prior write (e.g., bit line BL) were falling from a voltage $V_{cc}-V_{be}$ which is the same voltage as during the read cycle, the crossover point with bit line BL_ rising would not occur until a time after $t_s$. Waveform BL' shown on FIG. 7 illustrates the behavior of bit line BL in the event where the write bias on transistor 38a were the same during a write cycle as during a read; the later cross-over point is illustrated in FIG. 7 as time $t_s'$. The access time improvement due to the varying bias on the high side pull-up transistor is the time difference between time $t_s'$ and time $t_s$.

Figure 8:
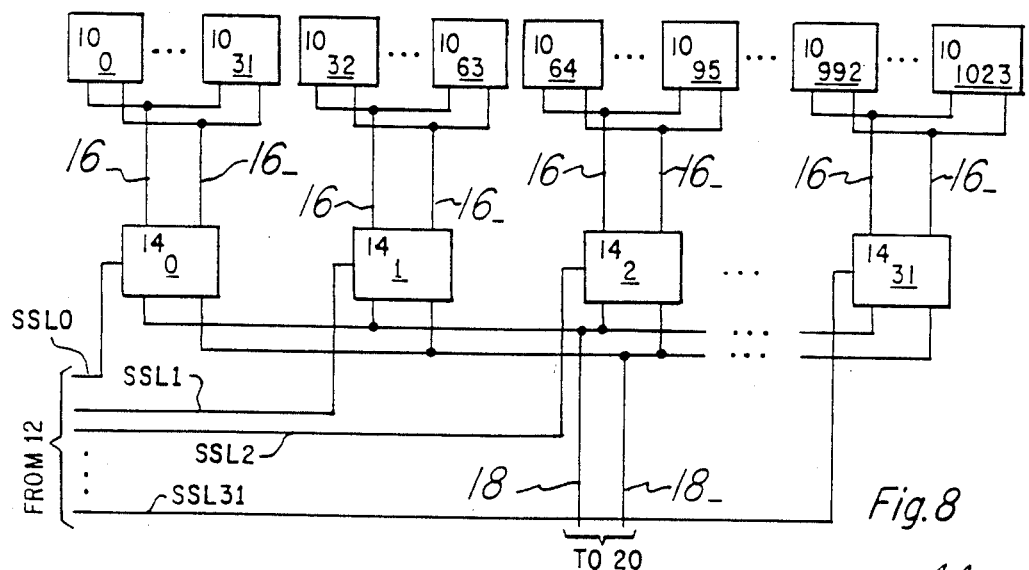
FIG. 8 is an electrical diagram, in block form, illustrating the interconnection of the first stage and second stage sense amplifiers.

Referring now to FIG. 8, the interconnection of the groups of first stage sense amplifiers 10 to the local data lines 16, and to their associated second stage sense amplifiers 14 will be described. As mentioned above, 1024 first stage sense amplifiers $10_0$ through $10_{1023}$ are grouped into groups of thirty-two, first stage sense amplifiers $10_0$ through $10_{31}$ being in a first group, first stage sense amplifiers $10_{32}$ through $10_{63}$ being in a second group, and so on. The output of each of the first stage sense amplifiers 10 in a group are wire-ANDed to a common pair of complementary local data lines 16 and 16_. Each pair of local data lines 16 from a group of first stage sense amplifiers 10 is presented to the inputs of the second stage sense amplifier 14 associated with the group. For example, second stage sense amplifier $14_0$ receives local data lines 16 and 16_ from first stage sense amplifiers $10_0$ through $10_{31}$.

One of the 1024 first stage sense amplifiers 10 is selected according to the ten bits of the column address to perform the sensing of the memory cell in the associated column which is in the selected row. This selection is accomplished by first stage Y decoder 8 which communicates a unique select line YSEL (not shown in FIG. 8) to each of first stage sense amplifiers 10, depending upon the value of the ten-bit column address received at address inputs $A_n$ of FIG. 2. The unselected first stage amplifiers 10 are not enabled, and will present a high impedance to both of the complementary local data lines 16. The result of the sensing operation performed by the selected one of the first stage sense amplifiers 10 is presented on the pair of local data lines 16 by one of the pair of lines being pulled to a low level, as will be explained in greater detail below.

The second stage sense amplifier 14 which corresponds to the group of first stage sense amplifiers 10 containing the first stage sense amplifier 10 selected by the column address will be enabled, to amplify the differential voltage presented thereto on local data lines 16, and to present the amplified differential voltage on a complementary pair of data-out lines 18 and 18_. The selection is performed by second stage Y decoder 12 which receives, in this example, the five most significant bits of the column address and which asserts one of select lines SSL0 through SSL31 to second stage sense amplifiers 14 to enable it. The outputs of second stage sense amplifiers 14 are wire-ORed together at data-out lines 18 and 18_. Unselected ones of second stage sense amplifiers 14 are disabled, and present a high impedance to both of data-out lines 18, allowing the selected one of second stage sense amplifiers 14 to set the state of data-out lines 18 and 18_. As shown in FIG. 2, data-out lines 18 and 18_ are received by input/output circuitry 20 for communication to input/output terminal I/O.

Figure 9:
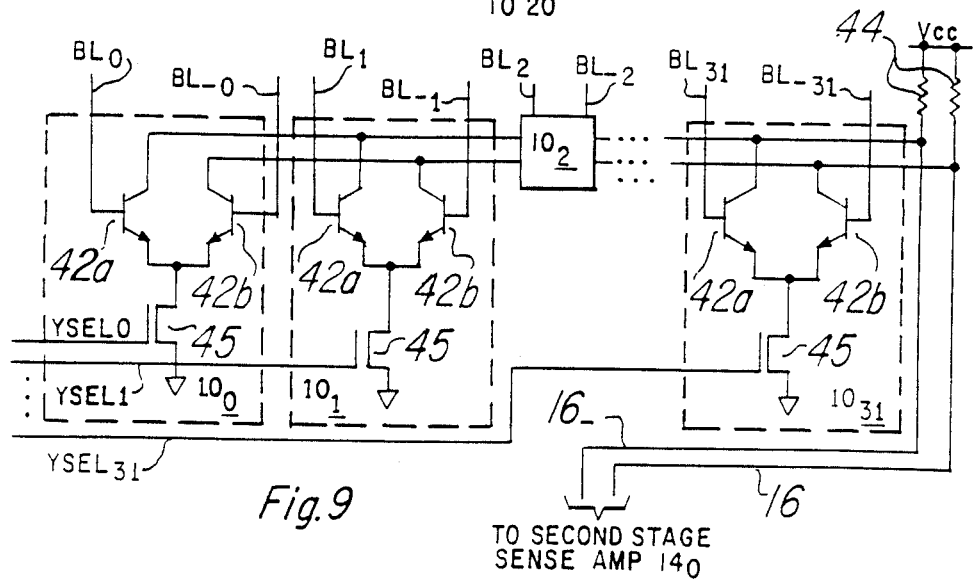
FIG. 9 is an electrical diagram, in schematic form, of the interconnection of a group of first stage sense amplifiers to a pair of local data lines.

Referring now to FIG. 9, the column decoding and sensing scheme of this embodiment of SRAM 1 will be explained. According to this embodiment of the invention and as described hereinabove relative to FIG. 2, one first stage sense amplifier 10 is associated with each of the 1024 columns in array 2. The first stage sense amplifiers 10 are grouped into thirty-two groups of thirty-two first stage sense amplifiers 10. FIG. 9 illustrates the interconnection of one group of thirty-two first stage sense amplifiers 10, and the driving of complementary local data lines 16.

First stage sense amplifiers $10_0$ through $10_{31}$ are schematically shown in FIG. 9. Each of said first stage sense amplifiers, as shown in FIG. 4, has transistors 42a and 42b having their bases connected to bit lines BL and BL_, respectively, and their collectors connected to local data lines 16_ and 16, respectively. The emitters of transistors 38a and 38b are connected together, for coupling to $V_{ee}$ through transistor 45. Each of first stage sense amplifiers 10 receives, at the gate of its transistor 45, a unique select signal on a line YSEL from first stage Y decoder 8. For example, first stage sense amplifier $10_0$ receives line $YSEL_0$, first step sense amplifier $10_1$ receives line $YSEL_1$, and so on. As described above, each of the 1024 first stage sense amplifiers receives a unique select signal on its own associated line $YSEL_n$, where n ranges from 0 to 1023, since SRAM 1 described herein is organized as a 256 k by 1 memory. Accordingly, only one of first stage sense amplifiers 10 is enabled for a given read operation by a high logic level on its associated select line YSEL, and the others of first stage sense amplifiers 10 not selected receive a low logic level on their select lines YSEL.

For the group shown in FIG. 9, if none of the lines $YSEL_0$ through $YSEL_{31}$ is asserted by first stage Y decoder 8, all of the transistors 45 will be off for the first stage sense amplifiers $10_0$ through $10_{31}$. In this case, resistors 44 will pull both local data lines 16 and 16_ to $V_{cc}$, since none of first stage sense amplifiers $10_0$ through $10_{31}$ are enabled to pull either line low.

In the case where one of the first stage sense amplifiers $10_0$ through $10_{31}$ in the group shown in FIG. 9 is selected, those unselected first stage sense amplifiers 10 within the group still receive a low logic level on their associated select lines YSEL, keeping each of the transistors 45 in the unselected first stage sense amplifiers 10 in the off state. For the selected one of first stage sense amplifier 10, however, a high logic level will be received on its select line YSEL, and its transistor 45 will be turned on, allowing sensing of the voltage differential on its associated pair of bit lines BL and BL_.

For example, assuming that line $YSEL_1$ goes to a high logic level due to first stage sense amplifier $10_1$ being selected, transistor 45 in first stage sense amplifier $10_1$ will be turned on. Accordingly, as described above, the one of transistors 42a and 42b which is associated with the higher of the bit lines $BL_1$ and $BL_{-1}$ will be turned on more than the transistor 42a or 42b which is associated with the lower of the bit lines $BL_1$ and $BL_{-1}$, the polarity of the differential voltage of course depending upon the data state stored in the memory cell 24 in the selected row. If, for example, the selected memory cell 24 stores data causing bit line $BL_1$ to be high relative to bit line $BL_{-1}$, transistor 42a in first stage sense amplifier $10_1$ will be turned on more strongly than transistor 42b therein, dominating the conduction of the current passed by transistor 45 acting as a current source. Transistor 38a will thus act to pull down local data line 16_; the pulling down of local data line 16_ is not affected strongly by unselected first stage sense amplifiers $10_0$ and $10_2$ through $10_{31}$, since their transistors 45 are in the off state. The conduction through transistor 42b in first stage sense amplifier $10_1$ is minimal due to the effect of transistor 45, so local data line 16 will remain in a high state, communicating the result of the sensing operation by first stage sense amplifier $10_1$ to second stage sense amplifier $14_0$.

Figure 10:
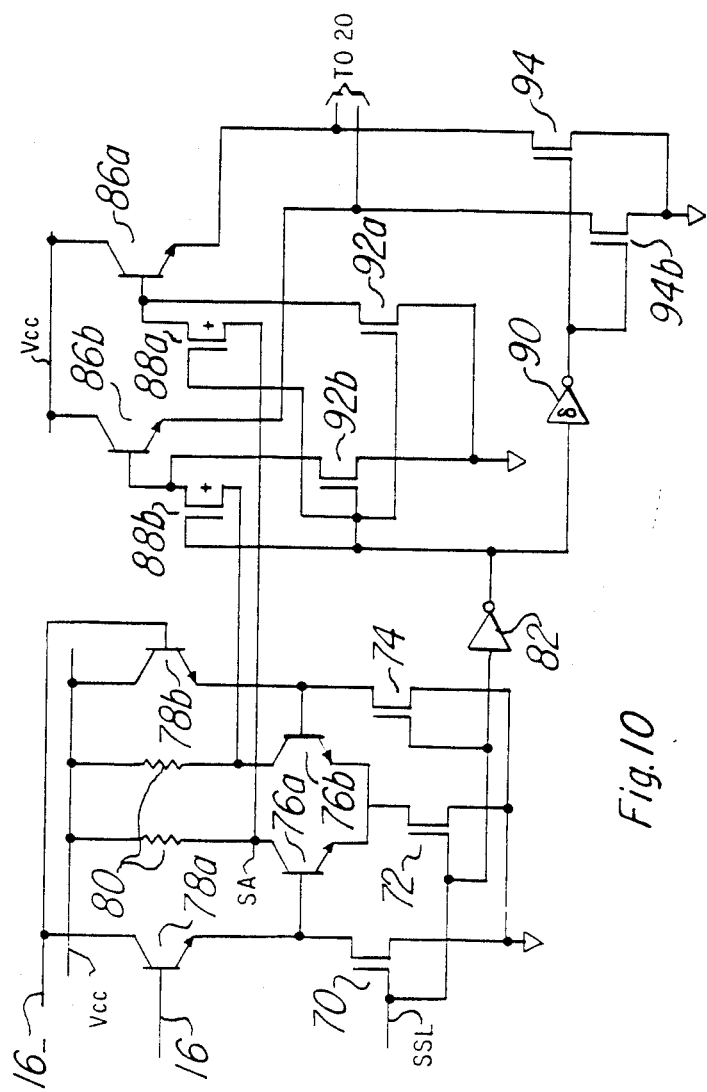
FIG. 10 is an electrical diagram, in schematic form, of a second stage sense amplifier.

Referring now to FIG. 10, the construction and operation of a second stage sense amplifier 14 will be explained in detail. On the input side of second stage sense amplifier 14, local data line 16 is connected to the base of n-p-n transistor 78a, which has its collector connected to $V_{cc}$ and its emitter connected to the base of n-p-n transistor 76a and to the drain of n-channel transistor 70. Transistor 76a has its collector connected through a pull-up resistor 80 to $V_{cc}$, and has its emitter connected to the drain of n-channel transistor 72. Similarly, local data line 16_ is connected to the base of n-p-n transistor 78b which has its collector connected to $V_{cc}$ and its emitter connected to the base of n-p-n transistor 76b and to the drain of n-channel transistor 74. Transistor 76b has its collector connected through another pull-up resistor 80 to $V_{cc}$, and has its emitter connected to the drain of n-channel transistor 72. Transistors 70, 72 and 74 have their sources connected to $V_{ee}$. Line SSL from second stage Y decoder 12, is connected to the gates of n-channel transistors 70, 72 and 74.

In operation, when second stage sense amplifier 14 is not selected by second stage Y decoder 12, line SSL will be at a low logic level. Transistors 70, 72 and 74 will all be turned off, so that none of n-p-n transistors 78 and 76 will conduct current, regardless of the state of local data lines 16 and 16_. Accordingly, nodes SA and SB, at the collector of transistors 76a and 76b, respectively, will be pulled to $V_{cc}$ through resistors 80 in the unselected state.

When second stage sense amplifier 14 is selected, line SSL will be at a high logic state, turning on transistors 70, 72 and 74. In the selected condition, the input side of second stage sense amplifer 14 is enable to detect the differential voltage between local data lines 16 and $16_{13}$. Transistors 78a and 78b communicate the voltages of local data lines 16 and 16_, respectively, reduced by a base-emitter diode drop ($V_{be}$), to the bases of transistors 76a and 76b, respectively. The input side of second stage sense amplifier 14 will thus operate in a similar manner as first stage sense amplifier 10, with transistor 72 serving as a current source for emitter-coupled transistors 76a and 76b. In the example discussed above, with local data line 16 at a higher voltage than local data line 16__, the majority of the current passed by transistor 72 will pass through transistor 76a rather than transistor 76b. Accordingly in this example, node SA will be at a lower voltage than node SB.

Looking now to the output side of second stage sense amplifier 14, p-channel transistor 88a has node SA connected to its drain, and has its source connected to the base of n-p-n transistor 86a. Similarly, node SB is connected to the drain of p-channel transistor 88b, which has its source connected to the base of n-p-n transistor 86b. Transistors 86a and 86b have their collectors connected to $V_{cc}$, and their emitters to data-out lines 18__ and 18, respectively. The base of transistors 86a and 86b are also connected to the drain of n-channel transistors 92a and 92b, respectively, each of which has its source connected to $V_{ee}$. Line SSL, inverted by inverter 82, is connected to the gates of transistors 88a and 88b. Line SSL is also connected to the gate of transistors 92. Each of second stage sense amplifiers 14 has a pair of n-channel transistors 94a and 94b, with their source-to-drain paths connected between data-out lines 18__ and 18, respectively, and $V_{ee}$. The output of inverter 82, through inverting delay stage 90, drives the gates of transistors 94a and 94b. Inverting delay stage 90 consists of a CMOS inverter which has a relatively small p-channel pull-up transistor and a relatively large n-channel pull-down transistor. This allows inverting delay stage 90 to have a substantial delay for one transition only, with the output of inverting delay stage 90 making a high-to-low transition quickly, but making a low-to-high transition relatively slowly, for the reasons described hereinbelow.

In operation, when second stage sense amplifier 14 is not selected, the output of inverter 82 will be at a high logic level. Accordingly, transistors 88 will be turned off, and transistors 92 will be turned on, pulling the bases of transistors 86 to $V_{ee}$ to turn them off. Accordingly, second stage sense amplifier 14 will be presenting a high impedance to data-out lines 18 and 18__; it should be noted that the others of the thirty-two second stage sense amplifiers 14 are connected to data-out lines 18 and 18__ in a similar manner as the second stage sense amplifier 14 shown in FIG. 8. Transistor 94a and 94b will also be turned off (in the steady state), so that unselected second stage sense amplifiers 14 present a high impedance to data-out lines 18 and 18__. The connection of the thirty-two second stage sense amplifiers 14 to data-out lines 18 and 18__ is thus in the nature of a wired-OR, with any one of the second stage sense amplifiers being able to pull up one of the data-out lines 18 or 18__ with the unselected ones of second stage sense amplifiers 14 presenting, essentially, a high impedance thereto.

When second stage sense amplifier 14 is selected, the output of inverter 82 will be at a low logic level, turning on transistors 88a and 88b. Transistor 92a and 92b will be turned off, to allow the full differential voltage of nodes SA and SB will be presented to the gates of transistors 88a and 88b, respectively. The voltages of nodes SA and SB will then in turn be connected to the bases of transistors 86a and 86b.

With line SSL going to a high state, the output of inverter 82 goes low, and the output of inverting delay stage 90 will eventually go to a high logic level to turn on transistors 94a and 94b. As described above, however, inverting delay stage 90 is constructed so that it slowly makes a low-to-high transition at its output. This delay caused by delay stage 90 between the output of inverter 82 and the gates of transistors 94a and 94b is such that transistors 94a and 94b are turned on at a point in time after transistors 86a and 86b have begun driving data-out lines 18__ and 18, respectively. The delay of turning on transistors 94a and 94b provides access time improvement where the data state to be presented on data-out lines 18 and 18__ is the same as the data presented thereupon in the previous read cycle. If, for example, data-out line 18 were driven to a high level relative to data-out line 18__ in the previous cycle by another second stage sense amplifier 14, transistor 86b will only have to maintain the same level as already on data-out line 18, providing for a fast output response, so long as transistor 86b begins driving data-out line 18 before transistor 94b turns on. If transistor 94b turned on prior to transistor 86b turning on, data-out line 18 would be discharged to $V_{ee}$, and transistor 86b would have to pull data-out line 18 all the way back up to its eventual output level, slowing the access time performance of SRAM 1. Once turned on by inverting delay stage 90, transistors 94a and 94b act as current sources, allowing the voltage of data-out lines 18 and 18__ to reflect the differential voltage of nodes SA and SB. The voltage presented to data-out lines 18__ and 18, respectively, is substantially the voltage of nodes SA and SB, shifted by the base-emitter diode drop of transistors 86a and 86b, respectively.

In the example described above, with node SB being at a higher voltage than node SA, data-out line 18 will be at a higher voltage than data-out line 18__. Second stage sense amplifier 14 thus communicates the output of the selected first stage sense amplifier 10, from sensing the data state of the selected memory cell 24, to input/output circuitry 20.

In a subsequent cycle where the particular second stage sense amplifier 14 goes from a selected state to an unselected state, line SSL will go to a low logic level, turning off transistors 70, 72, 74, 88a and 88b, and turning on transistors 92a and 92b so that the bases of transistors 86a and 86b are pulled low. Inverting delay stage 90 causes transistors 94a and 94b to quickly turn off, since inverting delay stage 90 is constructed so that its output can quickly make the high-to-low transition responsive to the output of inverter 82.

The above-described invention thus provides reduced load on the first stage sense amplifiers 10 by grouping a reduced number of first stage sense amplifiers 10 to drive a pair of local data lines 16 and 16__, and by having a second stage sense amplifier for each group, selected by the most significant bits of the column address, to drive the global data-out lines 18 and 18__. The reduced drive allows for the provision of a single first stage sense amplifier 10 for each column, without requiring large drive transistors which may not fit within the column pitch of the array.

In order to realize the sense amplifier scheme described in the preceding discussion without significantly expanding the size of the integrated circuit required for incorporating the SRAM device, it is required, as indicated earlier to place each sense amplifier within the pitch of its associated column. A discussion on the layout of the scheme, including the above mentioned constraints, follows below.

Figure 11:
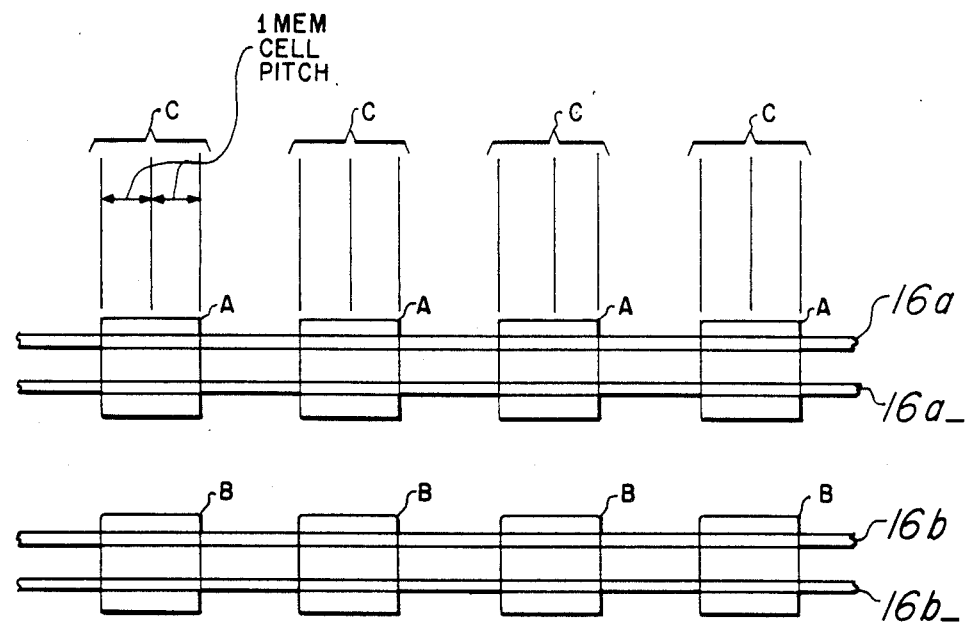
FIG. 11 is a drawing illustrating the sensing and decoding scheme layout.

FIG. 11 illustrates a basic concept behind the layout. A, and B each represent 1st stage sense amplifiers of a memory array with each sense amplifier being connected to respective data lines 16a, 16a— or 16b, 16b—. Since the sense amplifier (shown as A or B) itself requires the space of two memory cell pitches, then by arranging pairing two columns of memory cells C together and placing the paired columns and associated sense amplifiers A, B within the same two memory cell pitches, considerable circuit space is conserved by the layout. This pairing arrangement thus used for all columns to achieve the layout. The general point to be made by FIG. 11 is that pairs of columns of memory C and their associated sense amplifiers are positioned so as to fit within the pitches of those memory cell columns C as shown. The 1st stage sense amplifiers are to be stacked so as to fit within the pitch of memory cell 24 of FIG. 4.

Figure 11A:
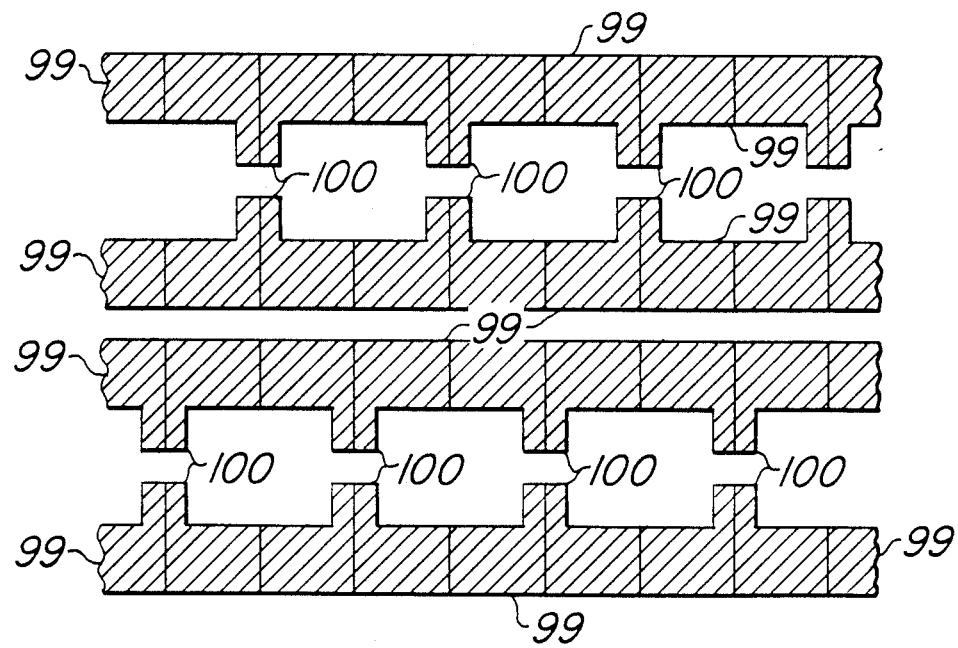
FIG. 11a illustrates a portion of the photolithographic mask which indicates the position of a continuous common collector region.

FIG. 11a illustrates another basic concept behind the invention. This figure shows a portion of a photolithographic mask which indicates the position of a continuous common collector region 99 for transistors 42a and 42b of FIG. 4. This type of collector is more advantageous than a series of individual collectors for transistors 42a and 42b because the perimeter capacitance of common collector region 99 is much less than the sum of the perimeter capacitance of a series of individual collectors for transistors 42a and 42b of FIG. 4. Although the total capacitance associated with collector regions is equal to the capacitance of the surface area of the region plus the capacitance of the perimeter of the region, the perimeter capacitance contributes more than the area capacitance to the total capacitance. The area capacitance of collector region 99 is probably larger than the sum of area capacitance of individual collector regions for transistors 42a and 42b of FIG. 4. However, since collector region 99's perimeter capacitance is smaller than the sum of individual collector perimeter capacitance, due to its above mentioned impact on total capacitance, collector 99 generally adds smaller total capacitance to a memory device than there would be if transistors 42a and 42b of FIG. 4 had individual collector regions. Also shown in FIG. 11a are area for collector contact regions 100. Contact regions 100 form the areas in which collector region 99 contacts other areas of the memory device.

A discussion of the physical layout follows.

Figure 12:
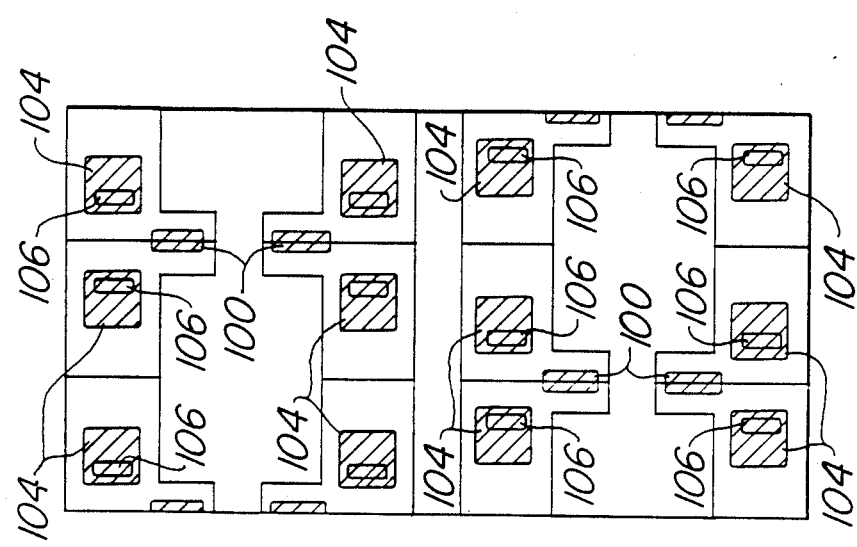

FIG. 12 illustrates the superposition of a plurality of mask portions so as to show the relative positions among one another of base regions 104, emitter regions 106 and collector contact regions 100 of transistors 42a and 42b of FIG. 4. FIG. 12 shows representative locations of base regions 104, emitter regions 106 and collector contact regions 100 for transistors 42a and 42b of FIG. 4 with transistors 42a's base regions 104, emitter regions 106 and collector contact regions 100 being associated with data lines 16a— and 16b— of FIG. 11 and corresponding parts of transistors 42b being associated with data lines 16a and 16b of FIG. 11. It should also be noted here that transistors 42a and 42b, shown in FIG. 4, within each sense amplifier are substantially identically sized to facilitate optimum sense amplifier operation.

Figure 13:
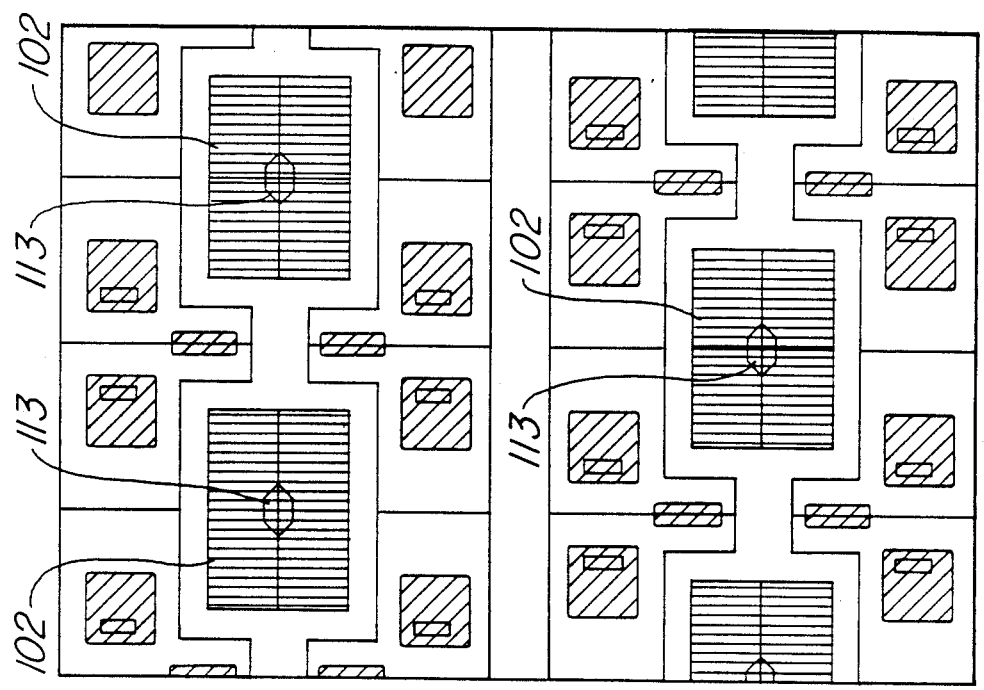

FIG. 13 illustrates mask portions in addition to those shown in FIG. 12. Transistors 45 are formed in p-type moat area 102 which includes an area where p-type moat contact 113 is placed.

Figure 14:
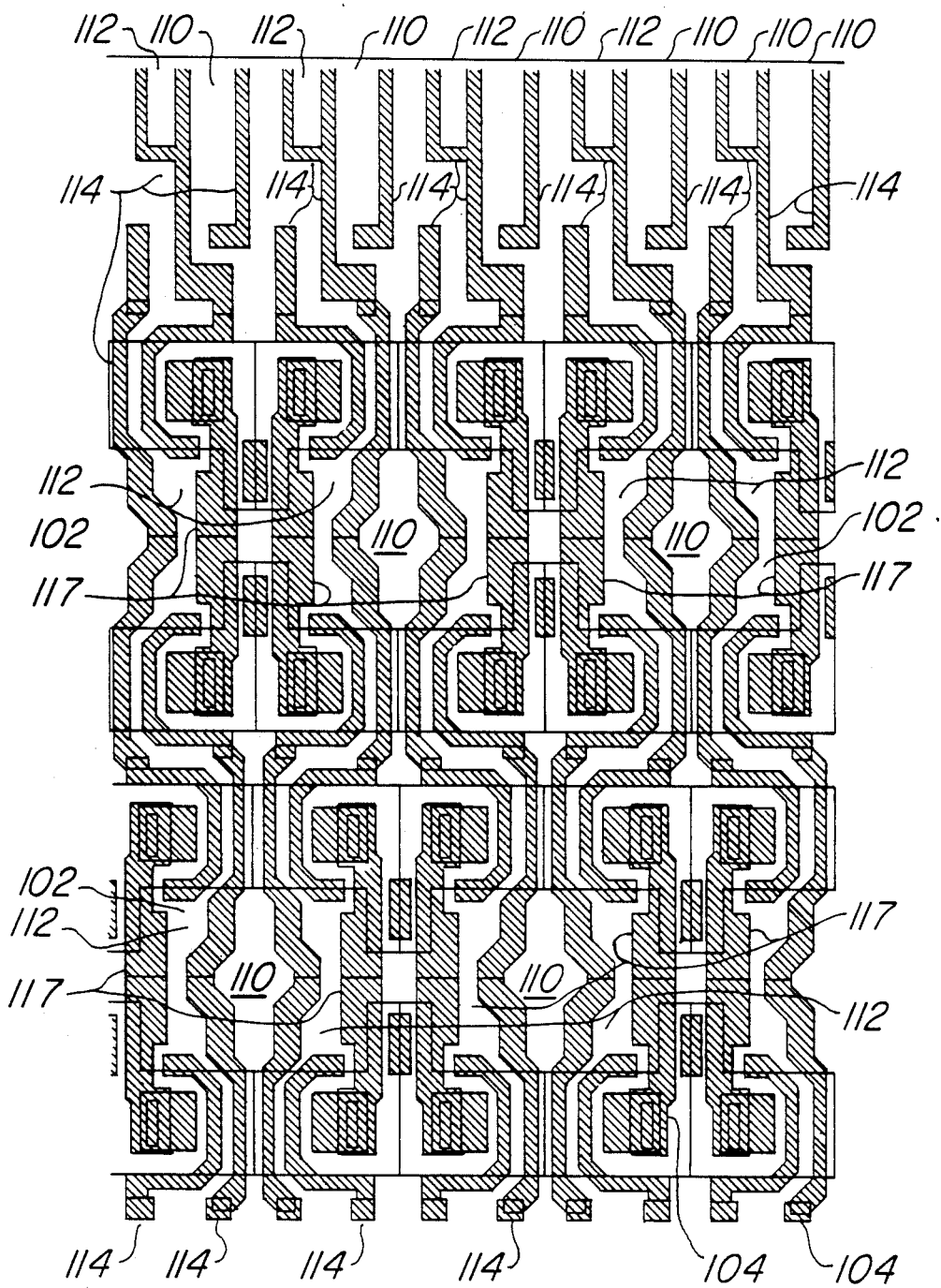

FIG. 14 illustrates the superposition of mask portions which define regions where sources 110 and drains 112 are formed for transistors 45 located in areas 102. Locations for sources 110 and drains 112 located in areas other than areas 102 are shown for transistors 47. Locations for gates 114, which are common to both transistors 45 and 47 are also illustrated. However, the gate regions shown are not continuous since completion of the gates takes place after processing with another mask set. Locations for polysilicon emitter connections 117 between emitters 106 are also illustrated. This connection will serve as an emitter connection for emitter coupled transistors 42a and 42b. Note that sources 110 are shared between transistors 42a and 42b of different sense amplifiers.

FIG. 14a illustrates mask portions indicating the location of local interconnect regions 119 formed between emitter connections 117 and drains 112.

Figure 15:
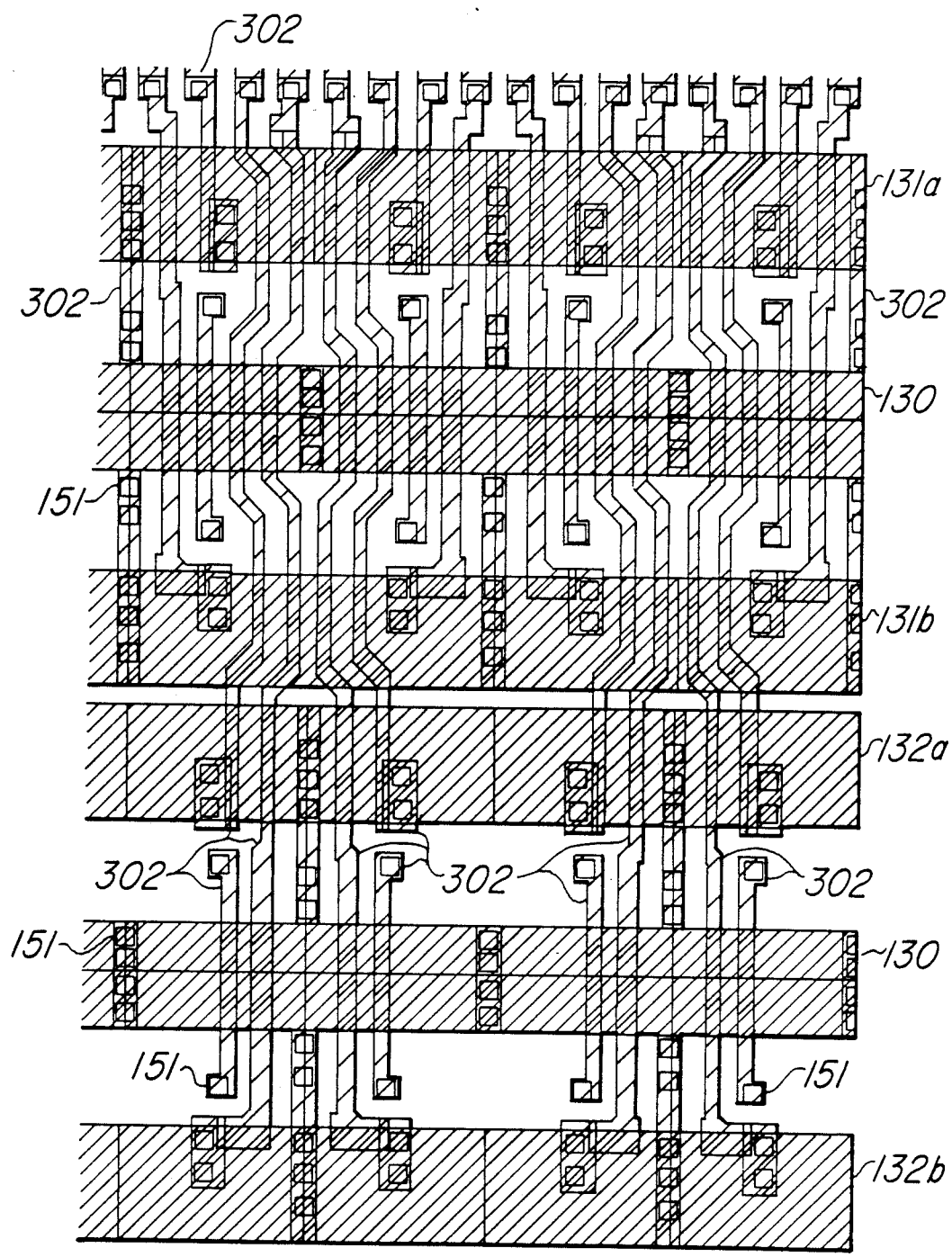

FIG. 15 illustrates mask portions indicating the location of the first metallization level 302 (shown as thin bars, which connect bases 104 to bit lines and which connect discontinuities in gate 114). FIG. 15 also indicates the location of metallization layers 130 grounding sources 110 as well as a metallization layers 131a connecting collector region 99 so as to form data line 16a. Likewise, also shown is the location of metallization layer 131b which connects another collector region 99 to form data line 16a—. Similarly the location of metallization layer 132a connecting collector region 99 so as to form data line 16b is also shown in addition to metallization layer 132b which connects region 99 so as to form data line 16b—. Layers 130, 131a, 131b, 132a, and 132b together represent a second level of metallization. Small black squares 151 (all are not labeled for ease of illustration) represent via contacts between first and second metallization levels and contacts of first metallization level 302 with underlying layers.

Now that the general layout scheme has been described, a method of fabricating bipolar transistors 42a and 42b and MOS transistors 45 and 47 (which by the way form a CMOS pair) all shown in FIG. 4, is discussed in detail below.

Transistors (47, 45, 42a, and 42b) form a BiCMOS device and their formation may be accomplished by forming bipolar transistors 42a and 42b according to know techniques in selected areas of the device, forming MOS transistors 45 and 47 according to known techniques in selected areas of the device, and interconnecting the two types of transistors. However, certain features of each type of transistor tend to be incompatible, from a process standpoint, with the other type, requiring a large number of process steps to form each. It is therefore preferably in the manufacture of such BiCMOS circuits to utilize structures which are useful in both types of transistors, in order to minimize the process complexity and cost.

Figure 16:
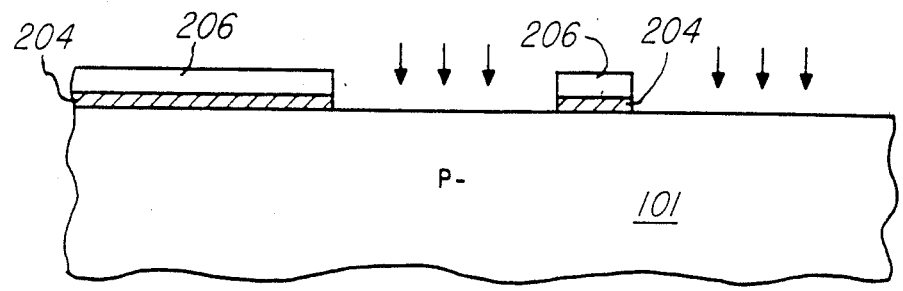
FIGS. 16 through 30 are cross-sectional views of a BiCMOS semiconductor structure in various states of fabrication, according to the invention.

FIG. 16 is a cross-sectional view of a lightly doped p-type single crystal silicon substrate 101 in wafer form, shown prior to the formation of a buried n-type layer. A masking layer consisting of silicon oxide layer 204 covered by silicon nitride layer 206 is formed according to any one of a number of well-known techniques; for example, silicon oxide layer 204 may be a grown oxide having a nominal thickness of 50 nm, and nitride layer may be a deposited by low pressure chemical vapor deposition (LPCVD) to nominally 100 nm thick. Layers 204 and 206 are patterned as shown in FIG. 16, and serve as a mask for the implant of the buried n+ region, such as implant indicated by the arrows of FIG. 16. The photoresist (not shown) used for the patterning of masking layers 204 and 206 is preferably removed prior to the heavy-dose buried n+ ion implantation. An example of an implant for forming the buried n+ region in this embodiment is an antimony implant at an energy on the order of 40 keV with a dose on the order of 5E15 ions/cm$^2$.

After the implant step, the diffusion of the antimony to form buried n+ region 208 occurs during a high temperature anneal, such as at 1250 degrees Celsius for 30 minutes, as is typically required for antimony diffusion. The resultant depth of buried n+ region 208 is in the range of 2 to 3 microns. Of course other dopants such as arsenic may be used to form buried n+ region 208, which may be driven with a lower temperature anneal (e.g., 1000 degrees Celsius for arsenic). Thick oxide regions 210 are also formed during this step in the locations not covered by nitride layer 206, to a thickness of between 250 and 300 nm. The masking nitride layer 206 is then stripped after the anneal.

Figure 17:
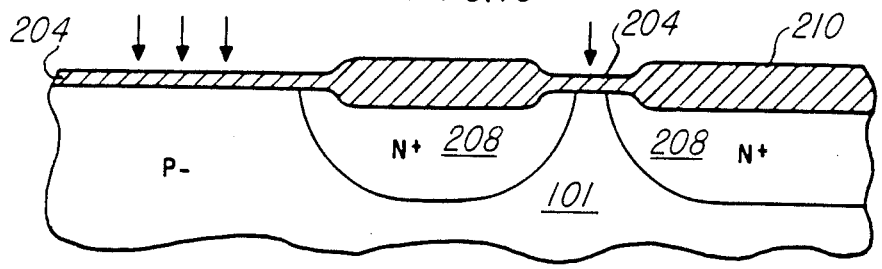

Thick oxide regions 210 of FIG. 17 serve as a mask to the ion implant for forming buried p-type regions. Accordingly, a boron implant (indicated in FIG. 17 by the arrows) is performed, for example at an energy in the range of 40 to 70 keV with a dose in the range of 5E12 to 2E13 ions/cm$^2$. An anneal step is then performed to drive the implanted boron, such an anneal being done at a temperature of 900 to 950 degrees Celsius for a period of from 30 to 60 minutes, depending upon the depth desired; in this embodiment, the depth of buried p region 212 is approximately 1 micron. It should be noted that the provision of buried p-regions by this implant is not essential in fabricating an operable device, as a p-type substrate 101 of sufficient doping concentration to prevent punch-through between adjacent buried n+ regions 208 could alternatively be used, without the need for a buried p-type region. Omission of the buried p-type regions also would allow the use of a thick oxide layer as the n+ implant mask, rather than the nitride/oxide sandwich of layers 204 and 206 described above.

In addition, it should be noted that the use of thick oxide layers 210 to mask the boron implant results in a buried p-type region which is adjacent to and self-aligned with buried n+ region 208, without requiring another mask and pattern step. Of course, such an additional mask and pattern step prior to the boron implant may alternatively be used if a space between the eventual p-type buried region and buried n+ region 208 is desired.

Figure 18:
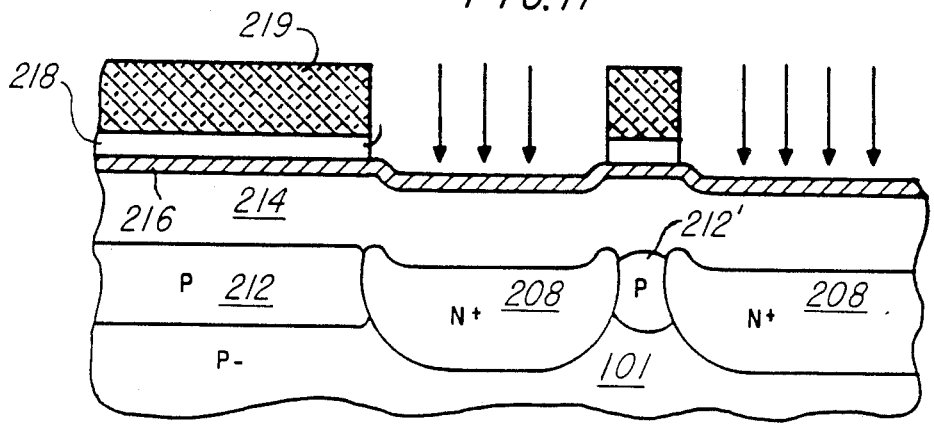

FIG. 18 illustrates buried p-type region 212 formed adjacent to buried n+ region 208; p-type region portion 212' lying in a narrow space between adjacent buried n+ regions 208 will serve as an isolation region between the adjacent buried n+ regions 208. Subsequent to the boron implant described above, thick oxide layer 210 (as well as oxide 204) is stripped, and epitaxial layer 214 is grown according to well known techniques. Epitaxial layer 214 in this embodiment of the invention is very lightly doped n-type material (i.e., greater than 10 ohm-cm), so as to be substantially intrinsic silicon. As will be described below, epitaxial layer 214 will be selectively implanted to form p-type and n-type wells into which both the MOS and bipolar transistors will be formed. For the benefit of the bipolar transistors, epitaxial layer 214 is kept relatively thin (for example, on the order of 0.75 to 1.50 microns) so that the length of the portion of the collector which is in the n-well (between a diffused base region and buried n+ region 208) is minimized, reducing the collector resistance.

A thin layer (e.g., 35 nm) of oxide 216 is grown on the surface of epitaxial layer 214, followed by LPCVD nitride layer 218 of an approximate thickness of 100 nm deposited thereupon. Nitride layer 218 is then patterned by photoresist layer 219 as shown in FIG. 18, to serve as a mask for the n-well implant (shown by the arrows of FIG. 18), in a manner similar to nitride layer 206 described above. Oxide 216 may remain as a passivation layer over the regions into which the implant will occur, since the energy of the n-well implant is high enough to place the dopant into epitaxial layer 214 through oxide 216.

Figure 19:
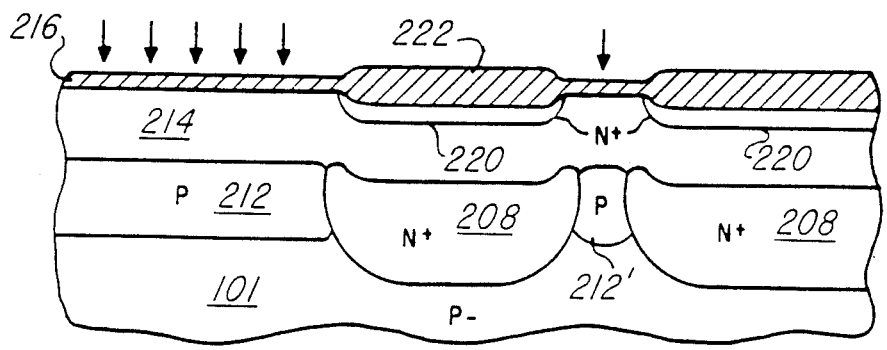

The ion implantation for forming the n-wells in epitaxial layer 214 may be done by a single ion implant operation, or by multiple implants, depending upon the dopant profile desired in the n-well. In this embodiment of the invention, a dual n-well implant is then performed using a low energy phosphorous implant followed by a high-energy phosphorous implant. For example, the first implant may be a dose of 1 E12 ions/cm$^2$ at 70 keV, and the second implant may be done at 350 keV with a dose on the order of 1.2E12 ions/cm$^2$. Of course, the n-well implant or implants may be significantly altered from that described herein, depending upon the desired dopant profile. The dual implant is followed by an oxide growth step, performed in a steam atmosphere at 900 degrees Celsius for 30 minutes, resulting in oxide layer 222 having a thickness on the order of 350 nm, covering the regions receiving the n-well implant. Nitride oxidation mask layer 218 is then stripped, and the p-well is implanted, masked by oxide regions 222 overlying the n-well regions 220. The p-well implant is a boron implant, for example having a dose of 1E12 ions/cm$^2$ at 50 keV, and is indicated by the arrows in FIG. 19.

Following the p-well implant, both the n-well and p-well implants are driven to the desired depth. For example, a 150 minute drive in an N$_2$/O$_2$ environment at 1000 degrees Celsius will typically result in a well depth of approximately 1 micron, for the implant doses and energies described hereinabove. As discussed above, prior BiCMOS fabrication methods utilized n-type epitaxy (for example, on the order of 1 ohm-cm or less), allowing for either omission or dose reduction of the n-well implant. For example, an n-well can be formed into an 0.5 ohm-cm epitaxial layer by way of a single low energy phosphorous implant, in order to minimize the potential of implant damage in the n-well regions (which will eventually contain n-p-n bipolar transistors). However, formation of the p-well in such an epitaxial layer requires counterdoping of the n-type epitaxial layer into p-type. As is well known in the art, this counterdoping degrades the carrier mobility of the resulting layer; since the p-well will be used in the channel region of the n-channel MOS transistors, the performance of the n-channel MOS transistors is accordingly degraded by such counterdoping. As is well known, n-channel transistors in a CMOS device generally have faster switching times than the p-channel transistors, due to the greater carrier mobility in the channel region; CMOS designs thus generally use n-channel MOS transistors as much as possible in speed-critical functions. Accordingly, degradation of carrier mobility in the channel region of the n-channel transistors in a CMOS or BiCMOS circuit will directly impact the performance of the circuit. The use of the intrinsic epitaxial layer 214 according to this embodiment of the invention reduces the mobility degradation in p-well 224 by minimizing the counterdoping required in its formation.

Formation of n-well 220 in intrinsic epitaxial layer 214 according to the above-described method has not resulted in noticeable implant damage or degradation of the bipolar transistors.

Figure 20:
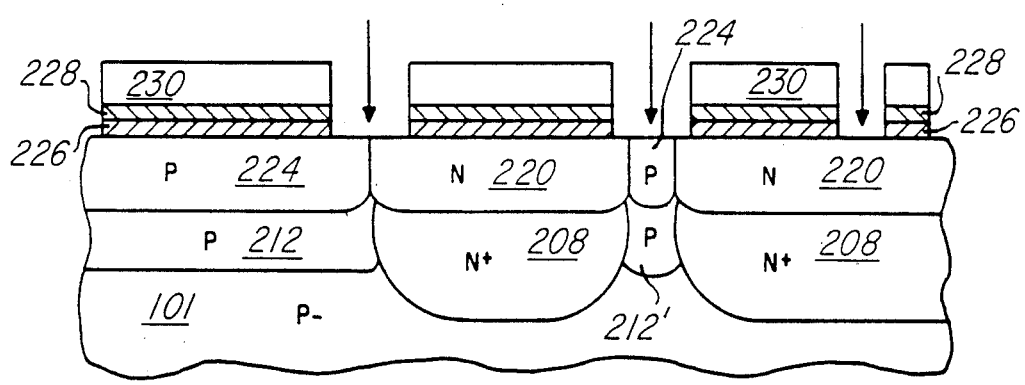

Oxide regions 222 and such oxide as is formed in the drive step are then stripped, leaving the n-well regions 220 and p-well regions 220 and p-well regions 224 as shown in FIG. 20. As in the case of the formation of the buried p-type regions 212, p-well regions 224 are formed self-aligned with n-well regions 220.

This embodiment further includes additional isolation regions between the p-well regions 224 and n-well regions 220. Accordingly, after the oxide regions 222 are etched, a 10 nm layer 226 of silicon dioxide is grown, upon which is deposited a buffer polysilicon layer 228, having a thickness of approximately 50 nm. LPCVD nitride layer 230 is then deposited upon polysilicon 228, and the nitride/polysilicon/oxide sandwich is then patterned to expose the isolation regions. The benefits of polysilicon layer 228 as a buffer in the formation of LOCOS isolation are described in U.S. Pat. No. 4,541,167, issued Sept. 17, 1985 and assigned to Texas Instruments Incorporated. After exposure of the isolation regions, a channel-stop is implanted to supplement the p-well boron concentration in p-wells 224 near the surface. This supplementation overcomes the segregation of boron from p-wells 224 into the isolation oxide regions during formation (such formation described below). An example of such an implant is a boron implant of a dose in the range of 3E12 to E12 ions/cm$^2$, at an energy on the order of 40 keV. However, it should be noted that portions of n-wells 220 also receive this implant (unless a separate masking step is performed), requiring optimization of the channel-stop implant dose to adequately compensate the boron segregation from p-wells 224 (i.e., to keep the field oxide threshold voltage high in p-wells 224) while avoiding overcompensating the portions of n-wells 220 receiving the implant (i.e., to keep the field oxide threshold voltage high in n-wells 220). A high pressure oxidation step (e.g., 52 minutes in a steam environment at 10 atmospheres pressure and 900 degrees Celsius) is then performed to form the recessed isolation oxide layers 232, such oxidation masked by nitride layer 230 over the active regions of the structure. It should of course be noted that any one of a number of known techniques for forming field oxide layers may be used to form oxide layers 232 (for example, more or less recess may be desirable, the poly buffering may be omitted, or formation of the oxide may occur at a different temperature or at atmospheric pressure); the method described in said U.S. Pat. No. 4,541,167 is preferable, for the reasons described therein.

Figure 21:
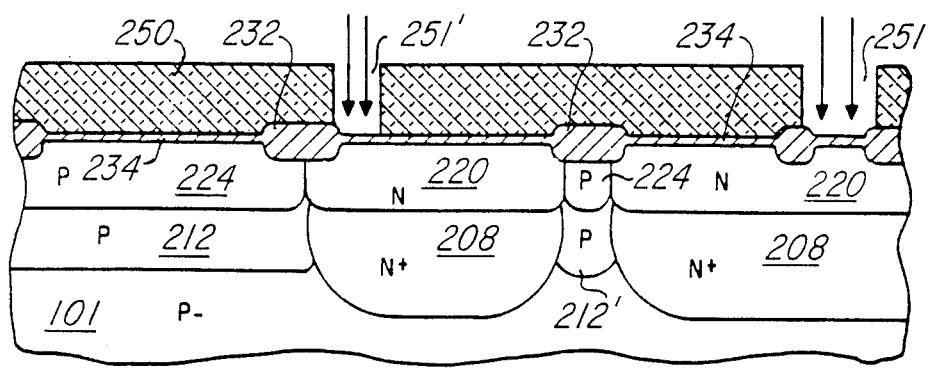

Referring now to FIG. 21, the resultant recessed isolation oxide regions 232 are illustrated. The thickness of oxide regions 232 formed by the above process is preferably at least 700 nm. Nitride layer 230, buffer polysilicon layer 228, and oxide layer 226 are etched according to conventional techniques, clearing the surface of the wafer. A thin pregate oxide, or dummy gate oxide, layer 234 is then grown to a thickness of the order of 20 nm for protection of the silicon surface during subsequent process steps leading up to the formation of the actual gate dielectric.

In operation, p-wells 224 and n-wells 220 will be biased so that the junctions therebetween will be reverse-biased, serving to isolate the wells from one another. Accordingly, a portion of a p-well 224 may be disposed between two n-wells 220 for isolating the two n-wells 220 from one another; an example of the need for such isolation is for isolating an n-well 220 which will contain MOS transistors from an n-well 220 which will contain bipolar transistors.

As is well known in the art, buried n+ regions 208 are especially suitable for collector electrodes of bipolar transistors. As shown in FIG. 21, photoresist layer 250 is patterned to expode a portion 251 of n-well region 220 in which bipolar transistors will be formed for an n-type implant (indicated by the arrows of FIG. 21) of the deep collector contact from the surface of n-well region 220 to buried n+ region 208. In addition, a direct contact through n-well 220 to buried n+ region 208 is preferable for n-wells 220 containing MOS transistors, for purposes of reducing latchup susceptibility; accordingly, a portion 251' of another n-well 220 is exposed to receive the deep collector implant. An exemplary deep collector implant is a high energy (on the order of 150 keV) phosphorous implant, with a dose in the range of 5E15 to 2E16 ions/cm$^2$. The resultant deep collector contact 252 is illustrated in FIG. 22.

Figure 22:
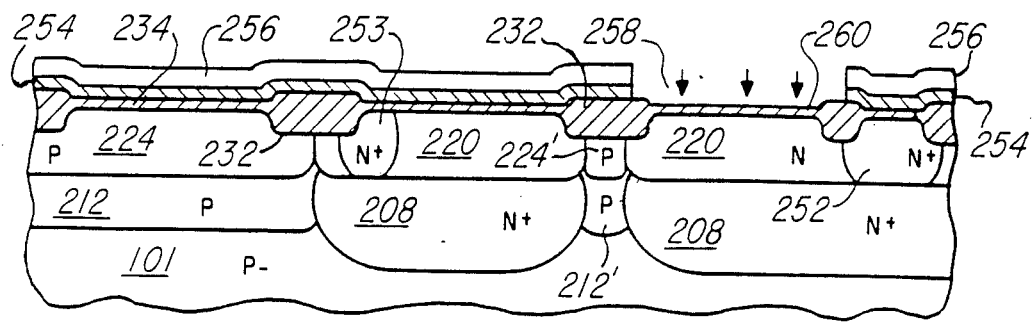

As shown in FIG. 22, photoresist layer 250 is then stripped, prior to definition of the mask layer for formation of the base region of the bipolar transistors. An LPCVD polysilicon layer 254 is first deposited to a thickness on the order of 100 nm to minimize stress-induced defects in a similar fashion as described in the above-referenced U.S. Pat. No. 4,541,167 for poly-buffered LOCOS isolation. The deposition of polysilicon 254 is then followed by the deposition of LPCVD nitride layer 256, to a thickness on the order of 270 nm. Nitride layer 256 and polysilicon layer 254 are then patterned and etched to define the base area at location 258 in the structure of FIG. 22.

Once base area 258 is defined by the patterning and etching of layers 254 and 256 as shown in FIG. 22, a relatively thick oxide layer 260, for example, from 60 to 150 thick, is grown over base area 258. Due to the presence of nitride layer 256, no such oxide 260 is of course grown other than the exposed base area 258. The growth of oxide layer 260 is followed by the boron implant to form the diffused base of the bipolar transistor, such an implant indicated in FIG. 22 by the arrows. An exemplary base implant through the thick oxide 260 is a boron implant of a dose of 8E13 ions/cm$^2$, at an energy of 80 keV. The thickness of pregate oxide 234, polysilicon layer 254 and nitride layer 256 are selected to block the base implant; the above described thicknesses (e.g., 20 nm, 100 nm, and 270 nm, respectively), are noted to be effective to block the above-described base implant. The above implant is effective to form the base region through an oxide layer 260 grown to a thickness of 140 nm. The advantages of the thick oxide layer 260 through which the base implant is made will be described in further detail hereinbelow. This base implant results in base region 104 shown in FIG. 23, extending to a depth approximately in the range of 300 to 400 nm from the surface. It should of course be noted that subsequent processing will reduce oxide layer 260 to a final thickness within a range from 40 to 130 nm, depending upon its thickness as grown.

Figure 23:
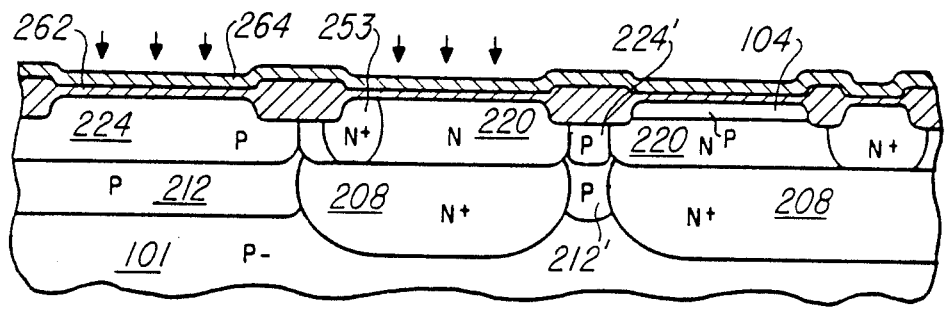

Subsequent to the base implant, nitride layer 256 is cleared by a wet etch, polysilicon layer 254 is removed by a plasma etch, and pregate ("dummy gate") oxide 234 is removed by another wet etch. Referring to FIG. 23, gate oxide 262, serving as the gate dielectric for the MOS transistors and, as will be described below, in the patterning of diffused resistors, is then grown to the desired thickness, for example on the order of 20 nm. A preferred method for growth of gate oxide 262 is dry-/steam/dry sequence at a temperature of 850 degrees Celsius; for purposes of the instant invention, however, any well known technique may of course be used for growth of the gate oxide 262, including the use of other dielectric materials or combination of materials. A buffer polysilicon layer 264 is then deposited by way of LPCVD to a thickness on the order of 125 nm. As is well known in the art, a threshold voltage adjust ion implant may be done at this time to adjust the threshold voltages of the MOS transistors according to the desired circuit operation. Such an implant (indicated by the arrows in FIG. 23) is masked only by the recessed isolation oxide layers 232, and is generally a p-type implant of relatively low (50 keV) energy. Alternatively, the threshold adjust implant may be done through pre-gate oxide 234, prior to the growth of gate oxide 262.

Figure 24:
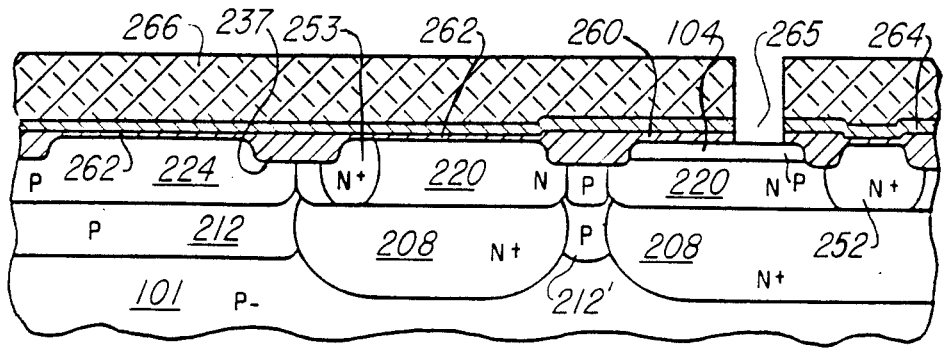
Figure 25:
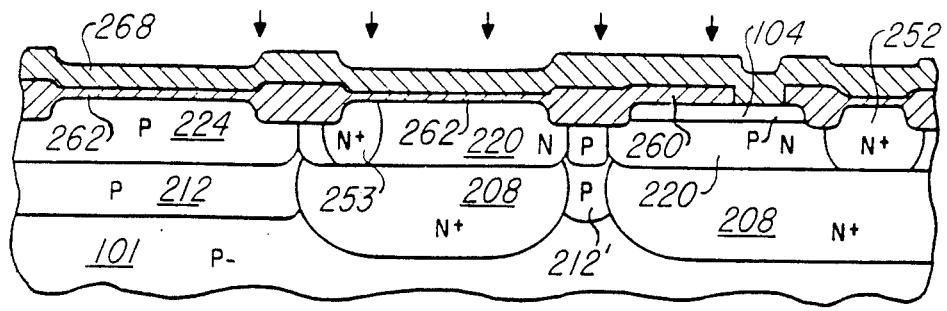

Referring now to FIG. 24, a layer of photoresist 266 is shown disposed above the surface of the wafer, patterned to define the location of the emitter for the bipolar transistor. Polysilicon layer 264 and oxide layer 260 above base region 104 are then etched to expose the location 265 of the emitter contact to base region 104. After exposing the emitter contact, photoresist 266 is stripped, and a layer of polysilicon 268 is deposited by LPCVD over the surface of the wafer, contacting base region 104 in the emitter contact area as shown in FIG. 25. Polysilicon layer 268 is deposited to a thickness of 325 nm, and will serve as the gate electrode for the MOS transistors, and as an interconnect level, if desired. Polysilicon layer 268 will also serve as the source of the dopant for diffusion of the emitter region into base region 104 of the bipolar transistor, as described below. Polysilicon layer 268 is additive to polysilicon layer 264 at locations not in the emitter contact, resulting in thicker polysilicon at those locations. Polysilicon layer 268 is then doped by way of a phosphorous implant of a dose on the order of 1E16 to 2E16 ions/cm$^2$ at an energy of 50 keV, as indicated by the arrows in FIG. 25.

Figure 26:
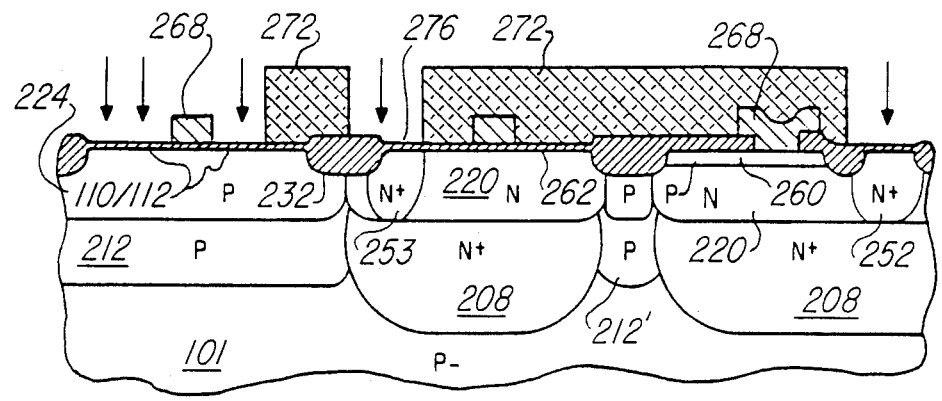

Referring now to FIG. 26, polysilicon layer 268 is shown after being patterned and etched for the formation of the gate electrodes for the MOS transistors and the emitter contact for the bipolar transistor. Subsequent to the polysilicon etch, a layer of TEOS oxide (not shown) may be deposited (e.g., of 30 nm) to passivate the silicon surface and to minimize ion channeling into the source and drain regions during subsequent implant steps; this thin layer of TEOS oxide will also serve to offset the reach-through implant from the polysilicon gate electrode 268, compensating for lateral diffusion of the reach-through implant for better alignment with the edges of gate electrode 268. Photoresist layer 272 is patterned to define the source and drain regions 110/112 for the n-channel MOS transistor, and for defining the n-well contact 276 to be implanted by a phosphorous reach-through implant (indicated by the arrows in FIG. 26). Collector contact 252 and buried n+ region contact 253 also can receive this implant. The reach-through implant is intended to form the shallow and relatively lightly-doped n-type diffusion in the formation of an n-channel MOS transistor having a "lightly-doped-drain" (or graded junction), as described in U.S. Pat. No. 4,566,175 issued Jan. 28, 1987 and assigned to Texas Instruments Incorporated. An example of such a reach-through implant is a dose on the order of 2E13 ions/cm$^2$ at an energy of 80 keV.

Figure 27:
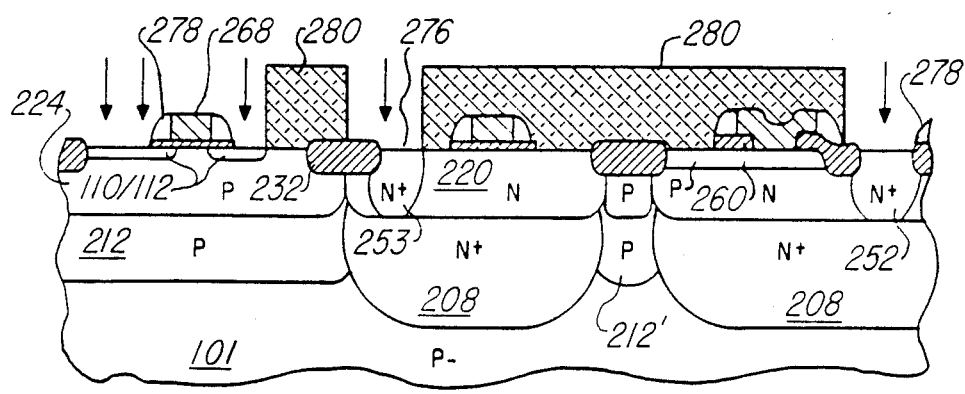

FIG. 27 illustrates the formation of sidewall oxide filaments 278 next to areas which include each side of polysilicon 268. Such formation is accomplished by stripping photoresist 272 (from FIG. 26), depositing a conformal layer of TEOS oxide over the wafer (in this example, approximately 200 nm thick), and then anisotropically etching the oxide layer as described in said U.S. Pat. No. 4,566,175, leaving the sidewall filaments 278 shown in FIG. 27. Thick oxide 260 is also etched at the locations not covered by the emitter polysilicon 268 and sidewall filaments 278. An additional layer of TEOS oxide (not shown) may be deposited as before for passivation of the surface and for reduction of ion channeling during implant, and photoresist 280 is patterned to again expose the n-channel source and drain regions 274, n-well contact 276, and collector contact 252. The source/drain implant is now performed, forming the deeper junction depth for the heavily-doped source and drain of the n-channel MOS transistor; an example of such a source/drain implant (indicated by the arrows in FIG. 27) is a high energy arsenic implant (e.g., at 150 keV) having a dose of 3E15 ions/cm$^2$, followed by a lower energy phosphorous implant (e.g., at 95 keV) having a dose on the order of 4E14 ions/cm$^2$.

Figure 28:
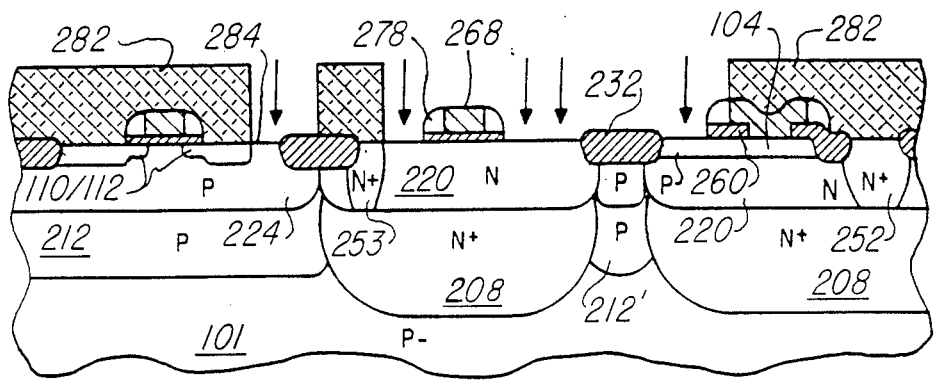

FIg. 28 illustrates the formed source and drain regions 110/112 of the n-channel MOS transistor in p-well 224, as well as the n+ contact 276 in n-well 220. Photoresist 280 is stripped, and a photoresist pattern 282 is formed to define the source-drain regions 110/112 for the p-channel MOS transistor in n-well 220, as well as p+ contact 113 in p-well 224 and p+ base electrode contact 286 to base region 104. The boron source-drain implant is indicated by the arrows in FIG. 28, for example, having a dose of 3E15 ions/cm$^2$ at an energy of 20 keV.

Figure 29:
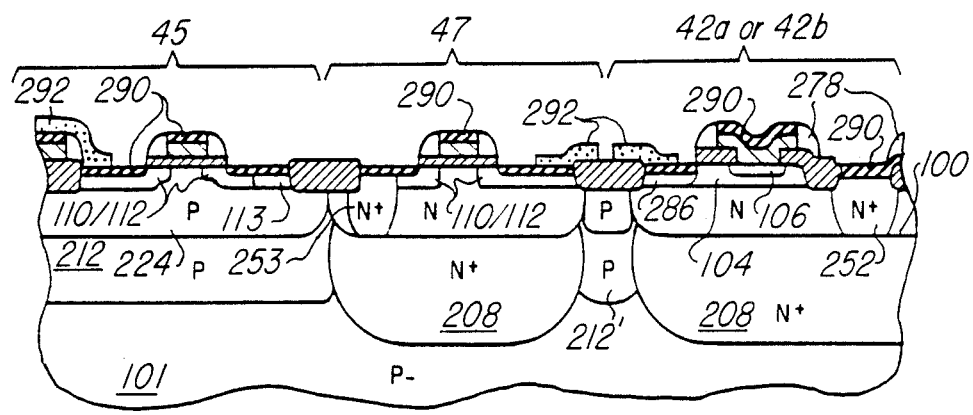

Referring now to FIG. 29, after the completion of both the p and n source/drain implants shown in FIG. 28, the implanted dopants are driven by a high temperature anneal in an inert atmosphere, such as a 30 minute anneal at 900 degrees Celsius in an argon atmosphere. This anneal not only drives the source/drain implants, but also causes the dopant in polysilicon 268 to diffuse into base region 104, forming emitter region 106 therein, as described in copending application Ser. No. 932,752 filed Nov. 19, 1986 and also assigned to Texas Instruments Incorporated. The emitter junction depth from such a process is in the range of 100 to 150 nm; the anneal also pushes the depth of base region 104 to a certain extent under the emitter (i.e., "emitter push"). After this source/drain and emitter anneal, any remaining oxide is cleaned from the source, drain and contact regions into which the source/drain implants were made, as well as polysilicon 268. The diffusions may then be silicide-clad if desired, by deposition of a metal such as titanium for a direct reaction with the exposed silicon, followed by an oxide cap, as described in U.S. Pat. No. 4,690,730 issued Sept. 1, 1987, assigned to Texas Instruments Incorporated. The result is the formation of titanium silicide layers 290 shown in FIG. 29. As described in U.S. Pat. No. 4,675,073, issued Jun. 23, 1987 and assigned to Texas Instruments Incorporated, local interconnections 292 may subsequently be made by patterning and etching the unreacted titanium on the silicide and oxide layers, and by exposing the patterned titanium film to a nitrogen atmosphere. As shown by FIG. 29, the above described fabrication process yields transistors 45, 47, and 42a/42b (only one such transistor shown, but a similar process forms either 42a or 42b).

Figure 30:
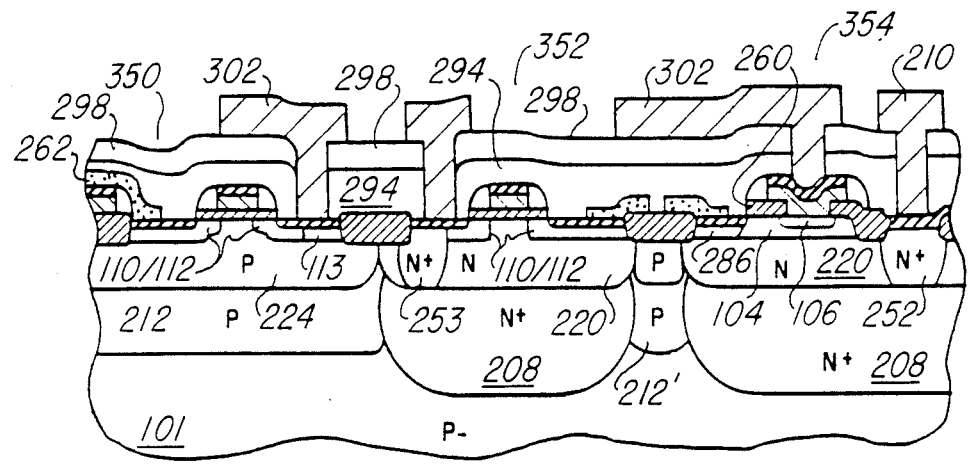

Referring now to FIG. 30, the first level of metal interconnect is illustrated as connected to the various locations within the fabricated structure. A multilevel dielectric is formed of a relatively thick (on the order of 1 micron) first layer 294 of LPCVD TEOS oxide. Layer 294 is then planarized and etched back as described in copending application Ser. No. 010,937, filed Feb. 5, 1987 and assigned to Texas Instruments Incorporated. The planarized TEOS oxide 294 is then coated with a second TEOS oxide layer (e.g., approximately 100 nm thick), followed by a layer of phosphorous doped oxide 298, having a thickness on the order of 300 nm and a phosphorous concentration of 5% by weight. Contact vias are patterned and etched, and the phosphorous-doped oxide 298 is activated and densified by a high temperature anneal, for example 60 minutes at 700 degrees Celsius. First level metallization 302 is then be deposited to make contact to the various locations in the structure, and may consist of either of the following: standard aluminum; doped aluminum metallization; a first layer of titanium tungsten alloy followed by a layer of CVD tungsten; sputtered tungsten under aluminum; titanium nitride; titanium tungsten or sputtered tungsten. The Ti/W-tungsten system is especially useful in multi-level metal systems. The second level of metallization discussed previously (made of one or more of the materials disclosed for the first metallization level) is added to the structure of FIG. 30, making contacts to first metallization 302 through vias (including selected contacts 151 of FIG. 15) formed according to known techniques.

It should be noted that the thick oxide layer 260 underlying the portion of polysilicon 268 which forms the emitter for the bipolar transistor achieves certain benefits. First, the emitter polysilicon 268 is separated from base region 104 by a greater distance due to the thicker oxide layer 260, reducing the capacitance between the emitter electrode and base region 104, improving the switching speed of the bipolar transistor. In addition, it can be seen that the first metal contact to the emitter electrode is made directly over diffused emitter region 106 in base region 104, saving the surface area required for the formation of the bipolar transistors, as well as reducing the emitter resistance by reducing the length of the current path in the emitter electrode.

Although the invention has been described in detail herein with reference to its preferred embodiment and certain described alternatives, it is to be understood that this description is by way of example only, and is not to be construed in a limiting sense. It is to be further understood that numerous changes in the details of the embodiments of the invention, and additional embodiments of the invention, will be apparent to, and may be made by, persons of ordinary skill in the art having reference to this description. Such changes and additional embodiments will of course include variations on the implant conditions, oxidation and diffusion cycles, and metallization systems described herein. It is contemplated that all such changes and additional embodiments are within the spirit and true scope of the invention as claimed below.

We claim:

1. A sensing and decoding scheme layout for a memory device which comprises:
   a memory array comprising rows and columns of memory cells, said columns of memory cells arranged in pairs; and
   a plurality of sense amplifiers each said sense amplifier including a plurality of transistors including terminals, each sense amplifier associated with a pair of memory cell columns and being connected in a one-to-one correspondence with said columns of memory cells, each sense amplifier and its associated memory cell column pair together being positioned so as to fit within the pitches of the memory cells of the associated memory cell column pair.

2. A sensing and decoding scheme layout as recited in claim 1 wherein said plurality of transistors of each said sense amplifier includes an emitter coupled pair of substantially equally sized bipolar transistors.

3. A sensing and decoding scheme layout as recited in claim 2 wherein selected transistors from said sense amplifiers further include common collector regions.

4. A sensing a decoding scheme layout as recited in claim 3 wherein each said common collector region is continuous.

5. A sensing and decoding scheme layout as recited in claim 4 wherein each said common collector region is aligned in a substantially straight line.

6. A sensing and decoding scheme layout as recited in claim 2 wherein said plurality of sense amplifiers further includes a field effect transistor connected to said emitter-coupled bipolar pair.

7. A sensing and decoding scheme layout as recited in claim 3 wherein said selected collector regions of said selected transistors from said sense amplifiers are connected to a first metallization layer.

8. A sensing and decoding scheme layout as recited in claim 6 wherein the sources of said field effect transistors are connected to a second metallization layer.

9. A sensing and decoding scheme layout as recited in claim 6 wherein sources are shared between selected field effect transistors of different sense amplifiers.

10. A sensing and decoding scheme layout as recited in claim 9 wherein said emitter-coupled bipolar transistor pairs from separate sense amplifiers are adjacent to their connected shared source field effect transistor.

11. A read/write memory which comprises:
   a memory array comprising rows and columns of memory cells, said columns of memory cells arranged in pairs;
   an address buffer for receiving an address signal;
   a row decoder, connected to said address buffer, for selecting a row of said array responsive to a row address portion of said address signal;
   a plurality of first stage sense amplifiers each associated with a pair of said memory cell columns and each being positioned so as to fit within the pitches of the memory cells of their associated memory cell column pair and grouped into a first group and a second group, each of said first stage sense amplifiers associated with a column of said array;
   a first local data bus connected to each of said first stage sense amplifiers in said first group;
   a second local data bus connected to each of said first stage sense amplifiers in said second group;
   a data-out bus;
   a first second stage sense amplifier connected to said first local data bus and to said data-out bus;
   a second second stage sense amplifier connected to said second local data bus and to said data-out bus; and column decode means, connected to said address buffer, for selecting a first stage sense amplifier responsive to a column address portion of said address signal, and for selecting a second stage sense amplifier responsive to said column address portion of said address signal so that the selected second stage sense amplifier presents on said data-out bus the output of the first stage sense amplifier selected by said column decode means.

* * * * *